United States Patent
Shimazaki et al.

(10) Patent No.: US 8,704,584 B2
(45) Date of Patent: Apr. 22, 2014

(54) OUTPUT DRIVER DEVICE FOR INTEGRATED CIRCUIT

(75) Inventors: Yoji Shimazaki, Kawasaki (JP); Naoya Shibayama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/272,594

(22) Filed: Oct. 13, 2011

(65) Prior Publication Data
US 2012/0032714 A1    Feb. 9, 2012

Related U.S. Application Data

(63) Continuation of application No. PCT/JP2009/001822, filed on Apr. 21, 2009.

(51) Int. Cl.
*H03K 17/296* (2006.01)

(52) U.S. Cl.
USPC ............ 327/395; 327/170; 327/400; 327/404

(58) Field of Classification Search
USPC ......... 327/112, 170, 392, 394, 395, 396, 399, 327/400, 403, 404, 436, 269, 271, 272
See application file for complete search history.

(56) References Cited

U.S. PATENT DOCUMENTS

| | | | |
|---|---|---|---|
| 5,220,209 A | 6/1993 | Seymour | |
| 5,850,159 A * | 12/1998 | Chow et al. | 327/394 |
| 6,285,236 B1 | 9/2001 | Stephens | |
| 6,559,676 B1 * | 5/2003 | Tomita | 326/81 |
| 6,570,413 B1 | 5/2003 | Kumagai et al. | |
| 6,587,100 B1 | 7/2003 | Shirasaki | |
| 6,917,227 B1 * | 7/2005 | Ochi | 327/111 |
| 7,332,943 B2 * | 2/2008 | Botti et al. | 327/112 |
| 2003/0128047 A1 * | 7/2003 | Humphrey | 326/30 |
| 2010/0244930 A1 * | 9/2010 | Ogawa et al. | 327/437 |

FOREIGN PATENT DOCUMENTS

| | | |
|---|---|---|
| EP | 0 913 942 A2 | 5/1999 |
| JP | 6-120789 | 4/1994 |
| JP | 6-177740 | 6/1994 |
| JP | 11-0055099 | 2/1999 |
| JP | 11-55099 | 2/1999 |
| JP | 11-234115 | 8/1999 |
| JP | 2001-7695 | 1/2001 |
| JP | 2001-77680 | 3/2001 |
| JP | 2001-94406 | 4/2001 |

OTHER PUBLICATIONS

International Search Report for PCT/JP2009/001822 mailed Jul. 14, 2009.
Japanese Notice of Rejection Ground mailed Feb. 5, 2013, issued in corresponding Japanese Patent Application No. 2011-510087.

* cited by examiner

*Primary Examiner* — Lincoln Donovan
*Assistant Examiner* — Jung H Kim
(74) *Attorney, Agent, or Firm* — Staas & Halsey LLP

(57) ABSTRACT

A driver device drives a load circuit by a common output signal from a first driver transistor and a second driver transistor. The driver device includes a first pre-driver unit that outputs a first driver control signal to the first driver transistor in response to the input signal; and a second pre-driver unit that outputs a second driver control signal to the second driver transistor in response to the input signal. The first pre-driver unit controls the first driver control signal in such a manner that the first driver control signal is rounded in the vicinity of a threshold of the first driver transistor and is sharply changed in a region exceeding the threshold.

5 Claims, 14 Drawing Sheets

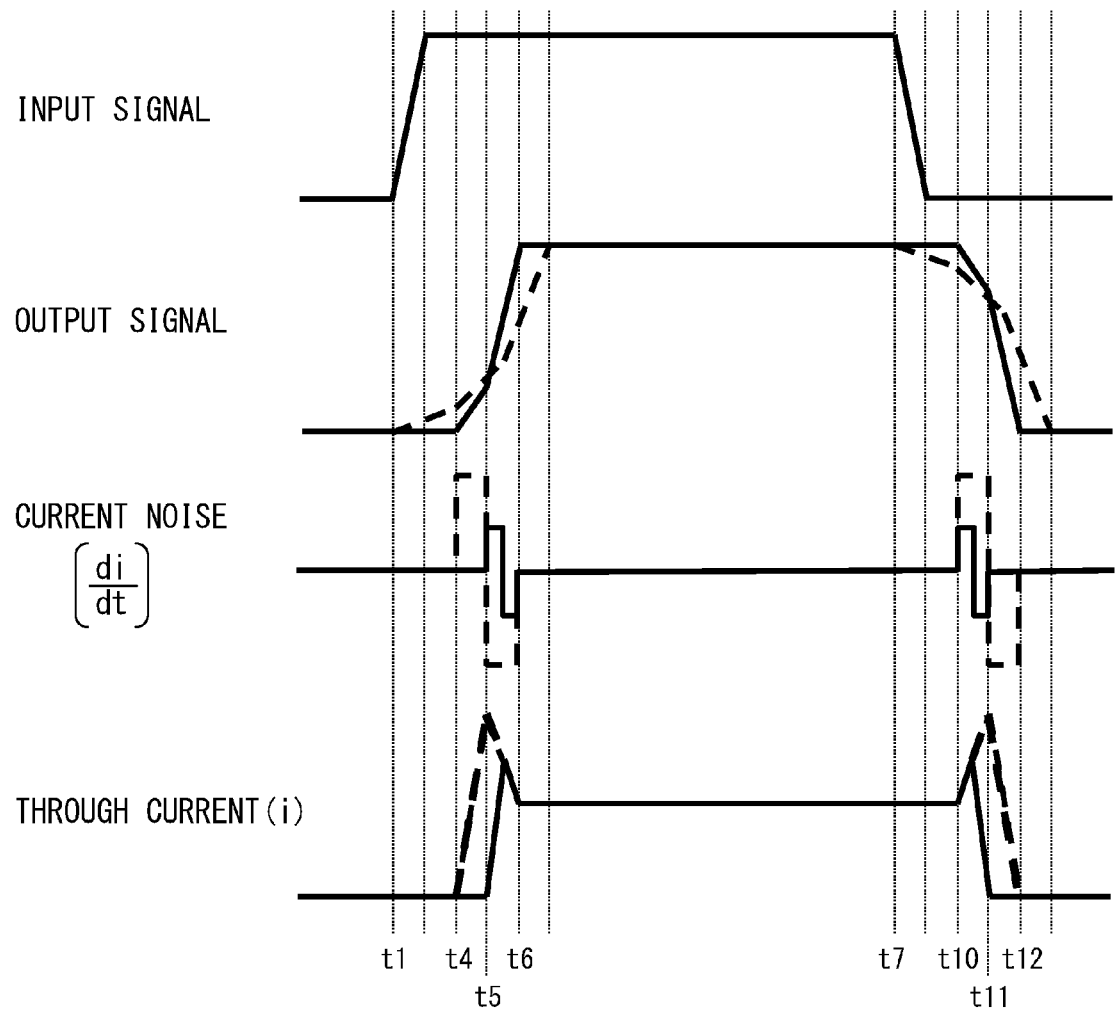
F I G. 5

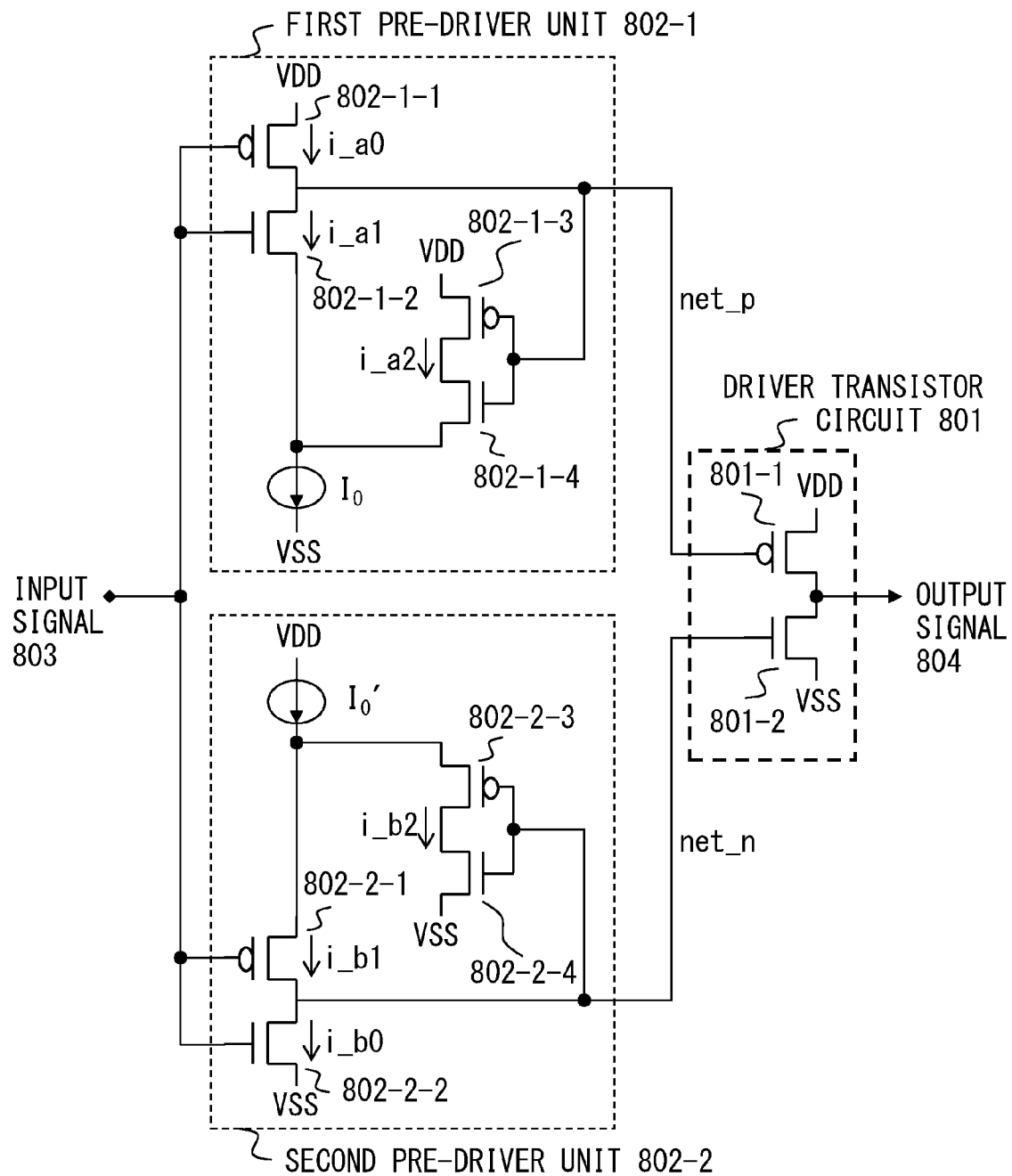
F I G. 8

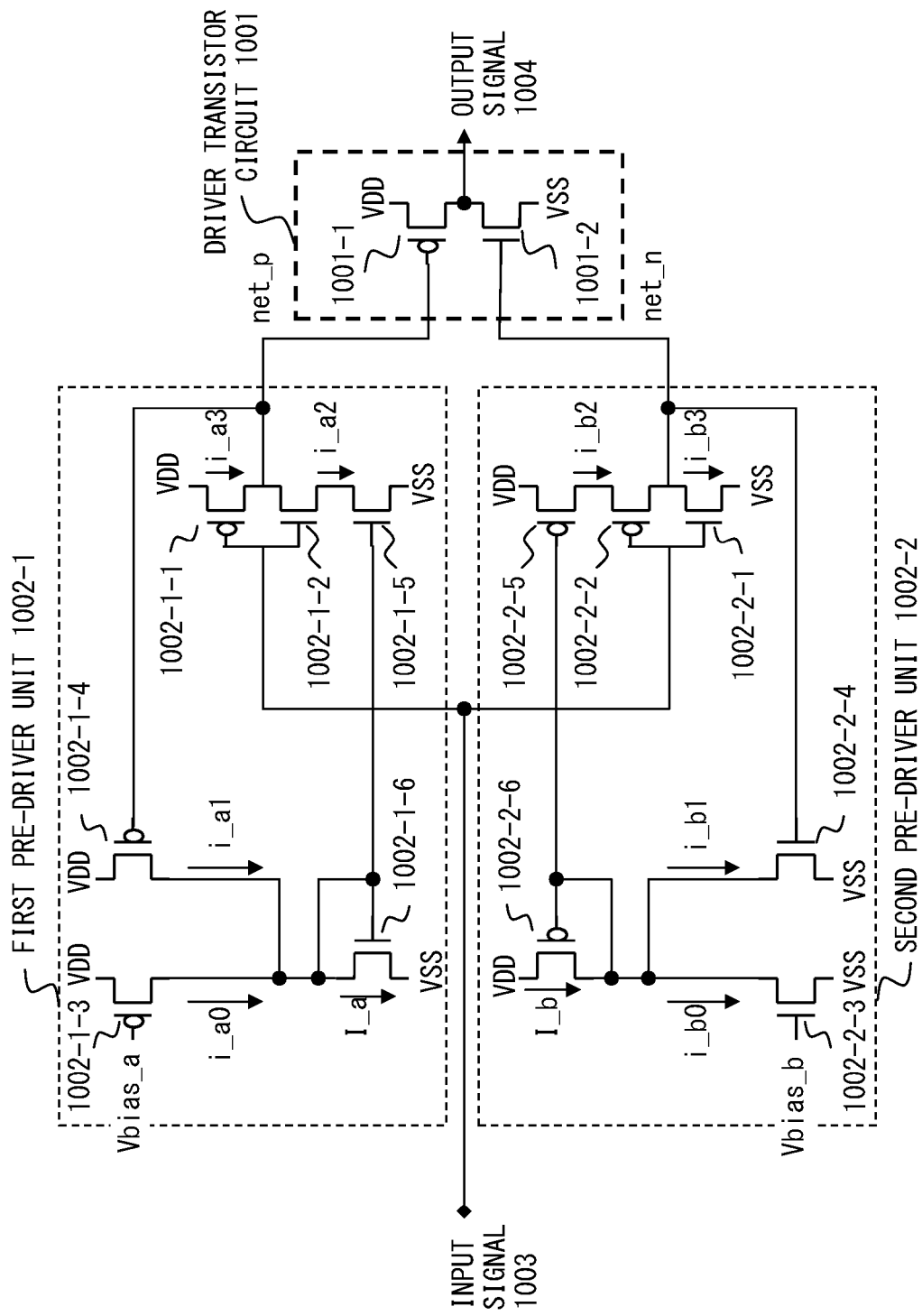
F I G. 10

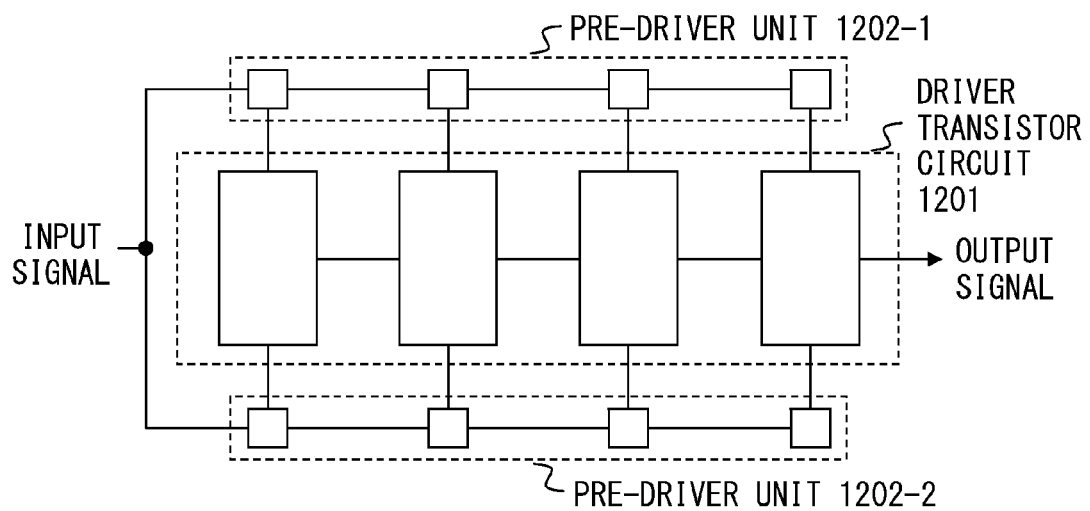
F I G. 1 2 A
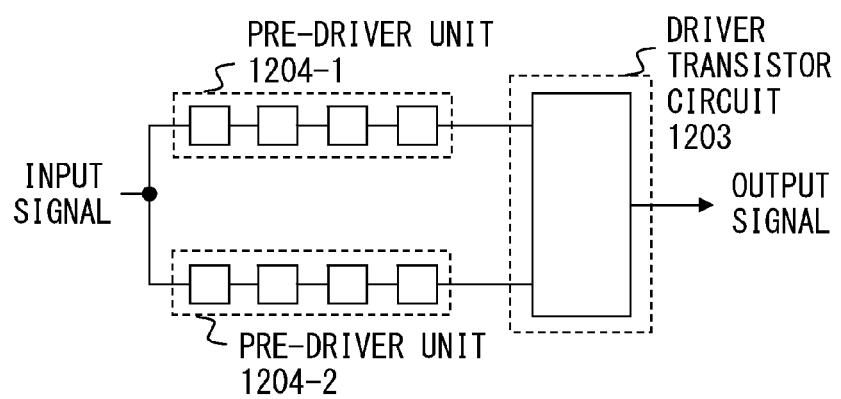
F I G. 1 2 B

OUTPUT DRIVER DEVICE FOR INTEGRATED CIRCUIT

CROSS-REFERENCE TO RELATED APPLICATION

This application is a continuation of an international application PCT/JP2009/001822, which was filed on Apr. 21, 2009.

FIELD

The embodiments described herein is related to a technique to control noise and power consumption in a driver for an integrated circuit.

BACKGROUND

An output driver circuit (hereinafter referred to simply as a "output driver") in an integrated circuit (LSI) generates a drive signal for a voltage-driven semiconductor switching element or the like externally connected to the LSI from an on/off signal in the LSI. The voltage-driven semiconductor switching element is, for example, an insulated gate bipolar transistor (IGBT) used in a power converter such as an inverter for variable-speed control of a motor.

FIG. 1A illustrates an example of a configuration of an output driver and a peripheral circuit.

An output signal 104 from a driver transistor circuit 101 drives an external load circuit such as a switching element not specially illustrated. The driver transistor circuit 101 includes, for example, a p-type metal oxide semiconductor field effect transistor (p-MOSFET) 101-1 and an n-MOSFET 101-2. Power supply voltage VDD is applied to the source terminal of the p-MOSFET 101-1, while the source terminal of the n-MOSFET 101-2 is grounded to ground potential VSS. The drain terminals of the p-MOSFET 101-1 and the n-MOSFET 101-2 are connected to each other. A signal net_p supplied to the gate terminal of the p-MOSFET 101-1 is asserted (set to be low level) and a signal net_n supplied to the gate terminal of the n-MOSFET 101-2 is negated (set to be low level). The p-MOSFET 101-1 and the n-MOSFET 101-2 are thereby turned on and off, respectively, to supply the voltage VDD as an output signal 104. On the other hand, the signal net_p supplied to the gate terminal of the p-MOSFET 101-1 is negated (set to be high level) and the signal net_n supplied to the gate terminal of the n-MOSFET 101-2 is asserted (set to be high level). The p-MOSFET 101-1 and the n-MOSFET 101-2 are thereby turned off and on, respectively, to cause the output signal 104 to fall to ground potential VSS.

With the change in the output signal 104 from the driver transistor circuit 101, noise (through current di/dt) is generated. Power supply noise is also generated by interaction between the driver transistor circuit 101 and the external switching element. To suppress this noise, waveforms (105, 109 in FIG. 1B) of the signal net_p and the signal net_n supplied to the p-MOSFET 101-1 and the n-MOSFET 101-2 may be rounded. This operation is performed with pre-driver circuits 102-1 and 102-2 (hereinafter referred to as "pre-driver") that respectively generate the signal net_p and the signal net_n. The waveform of the output signal 104 from the driver transistor circuit 101 is thereby to be rounded, thus suppress the noise (through current di/dt).

In a case where the waveforms of the signal net_p and the signal net_n are simply rounded, however, the time period during which the p-MOSFET 101-1 and the n-MOSFET 101-2 are simultaneously on is increased, so that a large through current flows between power supply voltage VDD and ground potential VSS. The through current causes current noise, voltage noise, power supply noise and drop of power supply voltage. As a result, deteriorations in quality of the waveform of the output signal 104, such as a reduction in signal level of the output signal 104, a timing error due to an increase in reflection and an increase in jitter due to a change in impedance of the driver transistor circuit 101, and retardation of a rise and a fall in the waveform, are caused. Also, an increase in the through current leads to an increase in power consumption of the integrated circuit including the driver transistor circuit 101. Further, when the waveforms of the signal net_p and the signal net_n are rounded, noise tolerance during state transition is reduced.

As a first related art with respect to these problems, a method such as that illustrated in FIG. 1B is known.

In the first related art, an input signal 103 in FIG. 1A is asserted (set to be high level) at time t1, for example, to turn on the external switching element. In response to this, the pre-driver 102-1 rounds the waveform of the signal net_p so that the signal net_p is slowly asserted as indicated by 105 in FIG. 1B. On the other hand, the pre-driver 102-2 controls the waveform of the signal net_n so that the signal net_n is sharply negated as indicated by 106 in FIG. 1B. As a result, referring to FIG. 1A, at the time of, for example, turn-on of the external switching element, the n-MOSFET 101-2 is first turned off and then the p-MOSFET 101-1 is turned on. The through current between the n-MOSFET 101-2 and the p-MOSFET 101-1 is thereby suppressed, for example, when the output signal 104 rises to the turn-on level as illustrated by 107 in FIG. 1B.

On the other hand, the input signal 103 in FIG. 1A is negated (set to be low level) at time t2, for example, to turn off the external switching element. In response to this, the pre-driver 102-1 controls the waveform of the signal net_p so that the signal net_p is sharply negated as indicated by 108 in FIG. 1B. On the other hand, the pre-driver 102-2 rounds the waveform of the signal net_n so that the signal net_n is slowly asserted as indicated by 109 in FIG. 1B. As a result, referring to FIG. 1A, at the time of, for example, turn-off of the external switching element, the p-MOSFET 101-1 is first turned off and then the n-MOSFET 101-2 is thereafter turned on. The through current between the n-MOSFET 101-2 and the p-MOSFET 101-1 is thereby suppressed, for example, when the output signal 104 falls to the turn-off level as illustrated by 110 in FIG. 1B.

As described above, the first related art reduces the noise due to the through current to some extent by sharpening the pre-driver output waveform at the turn-off side. The first related art, however, has a problem that the high-speed operation of the switching element in the following stage is hindered due to rounding of the waveform of the output signal 104 output from the driver transistor circuit 101, i.e., a non-sharp rise and fall in the waveform. The influence of noise due to a change in current accompanying a change in output voltage emerges large in the vicinity of the switching threshold (Vth) of the p-MOSFET 101-1 and the n-MOSFET 101-2. In the case of the first related art, however, the signal net_p is actually rounded so as to concave in a falling portion 105 as illustrated in FIG. 1B, and the signal net_n is actually rounded so as to be convex in a rising portion 109 as illustrated in FIG. 1B. Therefore the through current is not largely reduced. Also, the rise and fall of the output signal 104 are not sharp.

FIG. 2A illustrates a configuration according to a second related art. In this configuration, the output driver includes a plurality of pairs of p-MOSFET 201-1 and n-MOSFET 201-2 (#1 to #4) implemented as a driver transistor circuit 201.

Power supply voltage VDD is applied to the source terminal of each p-MOSFET 201-1 in the pairs #1 to #4. The source terminal of each n-MOSFET 201-2 in the pairs #1 to #4 is coupled to ground potential VSS. The drain terminals of the p-MOSFETs 201-1 and the drain terminals of the n-MOSFETs 201-2 are respectively coupled to each other. Output signals net_p1, net_p2, net_p3, and net_p4 from cascaded pre-drivers 202-1 (#1 to #4) are respectively supplied to the gate terminals of the p-MOSFETs 201-1 (#1 to #4). Output signals net_n1, net_n2, net_n3, and net_n4 from cascaded pre-drivers 202-2 (#1 to #4) are respectively supplied to the gate terminals of the n-MOSFETs 201-2 (#1 to #4). The output signal 204 is obtained from the junction of the drain terminals of the p-MOSFETs 201-1 and the n-MOSFETs 201-2. An input signal 203 is fed to the pre-drivers 202-1(#1) and 202-2(#1).

In this configuration, the input signal 203 in FIG. 2A is asserted at time t1, for example, to turn on an external switching element, as illustrated in FIG. 2B. In response to this, the output signals net_p1, net_p2, net_p3, and net_p4 from the cascaded pre-drivers 202-1 (#1 to #4) are sequentially asserted, as illustrated in FIG. 2B. Similarly, the output signals net_n1, net_n2, net_n3, and net_n4 from the cascaded pre-drivers 202-2 (#1 to #4) are sequentially negated, as illustrated in FIG. 2B. As a result, outputs from the pairs of the output drivers 201-1 and 201-2 (#1 to #4) are combined to obtain the output signal 204 illustrated in FIG. 2B.

On the other hand, the input signal 203 in FIG. 2A is negated at time t2, for example, to turn off the external switching element, as illustrated in FIG. 2B. In response to this, the output signals net_p1, net_p2, net_p3, and net_p4 from the cascaded pre-drivers 202-1 (#1 to #4) are sequentially negated, as illustrated in FIG. 2B. Similarly, the output signals net_n1, net_n2, net_n3, and net_n4 from the cascaded pre-drivers 202-2 (#1 to #4) are sequentially asserted, as illustrated in FIG. 2B. As a result, outputs from the pairs of output drivers 201-1 and 201-2 (#1 to #4) and combined to obtain the output signal 204 illustrated in FIG. 2B.

In the configuration illustrated in FIG. 2A, waveform characteristics of the pre-drivers 202-1 (#1 to #4) and the pre-drivers 202-2 (#1 to #4) and other factors are adjusted to perform delay control on switching of the plurality of driver transistors 201-1 and 201-2. However, changes in the waveforms of the signals net_p1, net_p2, net_p3, and net_p4, and net_n1, net_n2, net_n3, and net_n4 are not controlled. Therefore, the through current is not adequately reduced, and the rise and fall of the output signal 204 are not sharp.

In addition, the second related art requires a plurality of pairs of output drivers 201-1 and 201-2. In general, p-MOSFET 201-1 and n-MOSFET 201-2 for realizing the driver transistor circuit 201 have a large footprint. Thus, the output driver circuit in an integrated circuit according to the second related art has a problem in that its circuit scale is considerably large. For example, there is a need to mount an off chip driver (OCD) in a double data rate 2-synchronous dynamic random access memory (DDR2-SDRAM). In such a case, if the above-described second related art is used, the circuit scale may be increased and the amount of wiring in the LSI may be increased to such an extent that the design of the LSI is considerably complicated.

Japanese Laid-Open Patent Publications No. 11-234115, No. 06-177740, and No. 2001-94406 disclose further related art.

SUMMARY

According to an aspect of an invention, a driver device which drives a load circuit by a common output signal from a first driver transistor and a second driver transistor, the driver device includes: a first pre-driver unit that outputs a first driver control signal to the first driver transistor in response to the input signal; and a second pre-driver unit that outputs a second driver control signal to the second driver transistor in response to the input signal; wherein the second pre-driver unit sharply changes the second driver control signal so as to turn off the second driver transistor, and the first pre-driver unit controls the first driver control signal in such a manner that the first driver control signal is rounded in the vicinity of a threshold of the first driver transistor and is sharply changed in a region exceeding the threshold in order to delay the turn-on of the first driver transistor with respect to the turn-off of the second driver transistor, and the first pre-driver unit sharply changes the first driver control signal so as to turn off the first driver transistor, and the second pre-driver unit controls the second driver control signal in such a manner that the second driver control signal is rounded in the vicinity of a threshold of the second driver transistor and is sharply changed in a region exceeding the threshold in order to delay the turn-on of the second driver transistor with respect to the turn-off of the first driver transistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a diagram illustrating the effects of a waveform signal generated by the output driver device according to the first embodiment;

FIG. 8 illustrates a configuration of an output driver device according to a third embodiment;

FIG. 10 illustrates a configuration of an output driver device according to a fourth embodiment;

FIG. 12A and FIG. 12B are diagrams for explaining the effects of the embodiments.

DESCRIPTION OF EMBODIMENTS

Embodiments of the present invention will be described below in detail with reference to the accompanying drawings.

Figure 3:
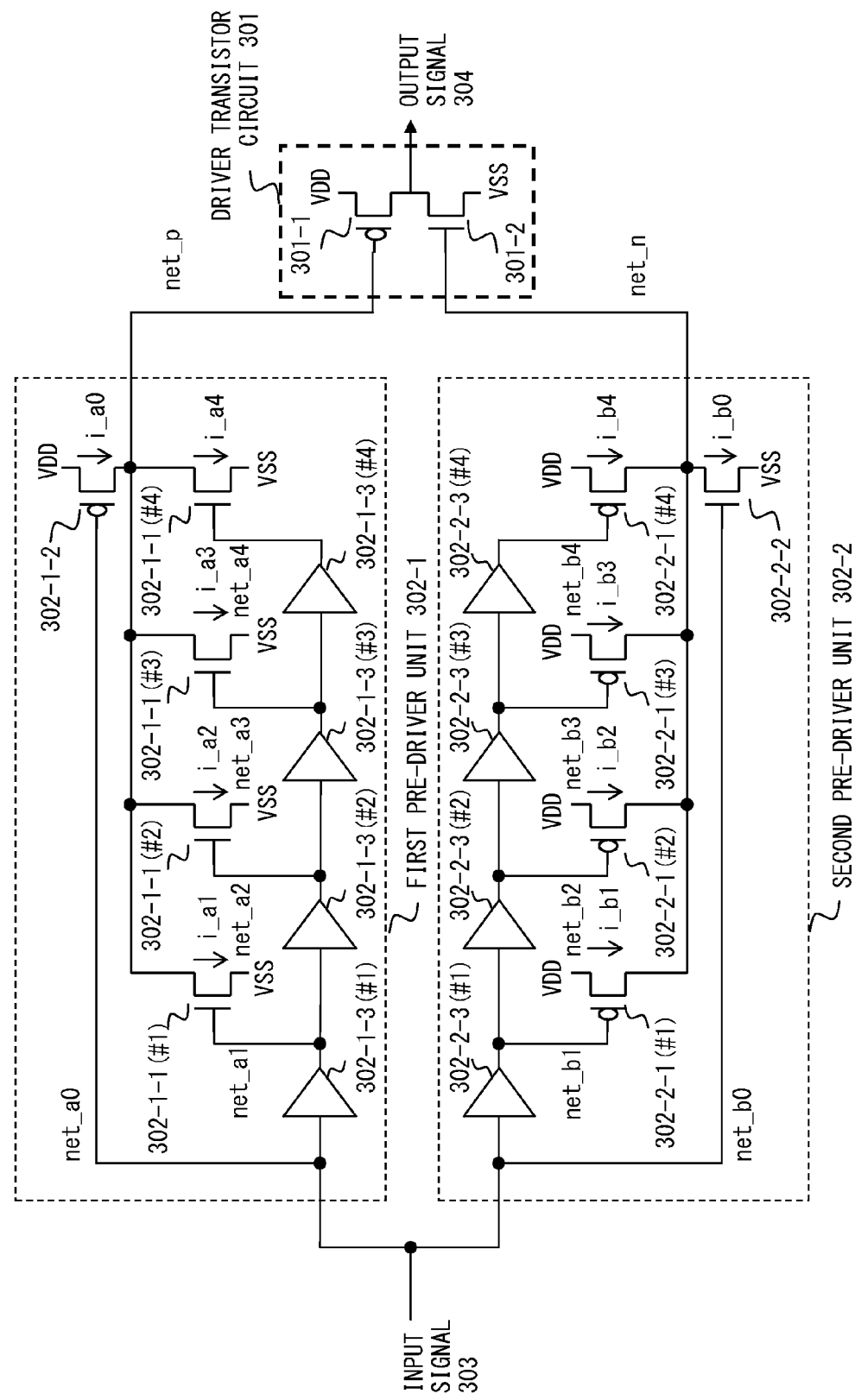
FIG. 3 illustrates a configuration of an output driver device according to a first embodiment.

FIG. 3 illustrates a configuration of an output driver device according to a first embodiment. The output driver device is disposed in an output section in an LSI, and controls turn-on/turn-off of an externally connected switching element not specially illustrated in the figure, based on on/off of an input signal 303 generated in the LSI.

In the output driver device, a first driver transistor circuit 301-1 included in a driver transistor circuit 301 supplies an output signal 304 which is on at the time of turning on the switching element connected to the driver output. The first driver transistor circuit 301-1 is realized, for example, by a p-MOSFET. Needless to say, the first driver transistor circuit 301-1 may be realized by means of any other transistor element capable of performing the same operation.

A second driver transistor circuit 301-2 supplies the output signal 304 which is on at the time of turn-off of the switching element. The second driver transistor circuit 301-2 is realized, for example, by an n-MOSFET. Needless to say, the second driver transistor circuit 301-2 may be realized by means of any other transistor element capable of performing the same operation.

A first pre-driver unit 302-1 generates a first driver control signal net_p based on the input signal 303 and supplies this control signal to the first driver transistor circuit 301-1. The signal net_p causes the first driver transistor circuit 301-1 to turn on in response to a rise of the input signal 303 while the signal amount and signal change timing are being controlled. Also, the signal net_p causes the first driver transistor circuit 301-1 to turn off in response to a fall of the input signal 303 sufficiently earlier than turn-on of the second driver transistor circuit 301-2 caused by a second driver control signal net_n.

A second pre-driver unit 302-2 generates the second driver control signal net_n based on the input signal 303 and supplies this control signal to the second driver transistor circuit 301-2. The signal net_n causes the second driver transistor circuit 301-2 to turn on in response to a fall of the input signal 303 while the signal amount and signal change timing are being controlled. Also, the signal net_n causes the second driver transistor circuit 301-2 to turn off in response to a rise of the input signal 303 sufficiently earlier than turn-on of the first driver transistor circuit 301-1 caused by the control signal net_p.

In FIG. 3, the first pre-driver unit 302-1 can be realized in the configuration described below.

A plurality of buffer circuits (BUF) 302-1-3 (#1 to #4) are cascaded. The input signal is fed to the first stage buffer 302-1-3 (#1). The buffers 302-1-3 (#1 to #4) sequentially delay the input signal. Each buffer 302-1-3 is, for example, a CMOS non-inverting circuit. The buffers 302-1-3 (#1 to #4) respectively generate output voltage signals net_a1, net_a2, net_a3, and net_a4.

A plurality of first control transistors (first TR) 302-1-1 (#1 to #4) are realized by transistors of one of two conduction types, e.g., n-MOSFETs. Each first TR 302-1-1 has a drain terminal connected to a signal line of the signal net_p and a source terminal connected to ground potential VSS.

A second control transistor circuit (second TR) 302-1-2 is a transistor of the other conduction type, e.g., a p-MOSFET. The second TR 302-1-2 has a source terminal connected to power supply voltage VDD and a drain terminal connected to the signal line of the signal net_p.

The first TRs 302-1-1 (#1 to #4) generate the signal net_p by respectively flowing drain current i_a1, i_a2, i_a3, and i_a4, and Cp*(dvp/dt) based on the output voltage signals net_a1, net_a2, net_a3, and net_a4. Cp is an equivalent capacitance between the signal line of the signal net_p and ground, and vp is a node voltage satisfying vp=net_p. These values are not indicated in FIG. 3.

Let the voltage of the input signal 303 now change from low level (hereinafter referred to simply as "L") to high level (hereinafter referred to simply as "H") or from H to L. At this time, each of the signals net_ai (i=1, 2, 3, 4) changes from L to H (or from H to L) while being delayed by the propagation delay time of the corresponding buffer circuit 302-1-1 (#1, #2, #3, or #4). Since each first TR 302-1-1 is an n-MOSFET, the drain current i_ai (i=1, 2, 3, 4) flows while increasing (or decreasing) in a linear region of the FET characteristics in response to the change in gate voltage from L to H (or from H to L).

On the other hand, the input signal 303 is directly supplied to the gate terminal of the second TR 302-1-2. Therefore, the drain current i_a0 of the second TR 302-1-2 depends on the difference between the voltage of the input signal 303 and power supply voltage VDD applied to the source terminal. Since the second TR 302-1-2 is a p-MOSFET, the drain current i_a0 flows while decreasing (or increasing) in a linear region depending on the change in the voltage of the input signal 303 from L to H (or from H to L).

The drain current i_ai is adjusted so as to be larger if the drain-source conductance Gai and the mutual conductance gmi dependent on the size of the channel (gate portion), i.e., W/L (channel width/channel length), of the first TRs 302-1-1 or the second TR 302-1-2 are larger. Note that i=0, 1, 2, 3, 4.

Thus, the voltage of the signal net_p depends on the drain currents i_ai (i=1, 2, 3, 4) and Cp*(dvp/dt) flowing through the first TRs 302-1-1 (#1, #2, #3, #4). The voltage of the signal net_p also depends on the drain current i_a0 flowing through the second TR 302-1-2. Further, the voltage of the signal net_p also depends on the conductance Gai or gmi (hereinafter referred to as "Gai (gmi)") of each first TR 302-1-1 and the second TR 302-1-2.

A current law as follows is satisfied at any time t.
i_a0=i_a1+i_a2+i_a3+i_a4+Cp*(dvp/dt)

The size of the channel of each first TR 302-1-1 is adjusted so that the following expression is satisfied.

Ga1(gm1)<Ga2(gm2)<Ga3(gm3)<Ga4(gm4)

and

Ga0(gm0)>>Ga1(gm1)+Ga2(gm2)+Ga3(gm3)+Ga4(gm4)

Based on this relationship, the first TRs 302-1-1 (#1 to #4) are sequentially turned on from the one having a lower conductance, i.e., W/L, as a drive force to the one having a larger drive force. Simultaneously, the time differences between signal propagations in the stages are adjusted by the BUFs 302-1-3, thereby adjusting the waveform of the signal net_p. Thus, it is possible to form a waveform rounded in the vicinity of the threshold of the output driver so that the waveform is convex as a whole, while forming a waveform not rounded within a region exceeding the threshold, i.e., a sharp waveform.

The above operation will be described with reference to the waveform diagram of FIG. 4.

The equivalent capacitance Cp as seen toward the first pre-driver unit 302-1 side from the gate terminal of the first driver transistor circuit 301-1 to which the signal line of the signal net_p is connected changes depending on the operating regions of the first TRs 302-1-1 and the second TR 302-1-2. However, for ease of description, it is assumed that the equivalent capacitance Cp is substantially constant between the gate of the first driver transistor circuit 301-1 and ground (VSS). Then, if the total conductance G is higher, the time constant (Cp/G) with respect to changes in the total conductance G is smaller and the response of the signal net_p is higher. It is assumed that the circuit illustrated in FIG. 3 operates in accordance with a small-signal equivalent model in a transient state. Under this assumption, the total conductance G is the sum of the conductances Gai (gmi) (i=0, 1, 2, 3, 4) of the first TRs 302-1-1 and the second TR 302-1-2.

In the following description, for example, a time section from t1 to t2 is referred to time t1-t2, a time section from t2 to t3 is referred to time t2-t3 and so on.

In time t1-t2, the voltage of the input signal 303 changes from L to H and the voltage of the signal net_a0 also changes from L to H. In this time section, however, the signals net_a1, net_a2, net_a3, and net_a4 are still L. Therefore, the H-level voltage held in the equivalent capacitance Cp is the voltage of net_p.

In time t2-t3, the change from L to H in the voltage of net_a0 in time t1-t2 propagates with a delay through the BUF 302-1-3 (#1) and the voltage of net_a1 changes from L to H. Also, in time t2-t3, the voltages of the input signal 303 and net_a0 are already H. In response to this change in net_a1, the current i_a1 corresponding to the low conductance Ga1 (gm1) of the first TR 302-1-1 (#1) flows to discharge the equivalent capacitance Cp. Since in time t2-t3 the voltage of net_a0 is H, i_a0 in the second TR 302-1-2 is substantially zero. Also, the time constant for net_p based on the first TR 302-1-1 (#1) is large because the conductance Ga1 (gm1) is small. Thus, the voltage waveform of net_p in time t2-t3 changes slowly (the slope is mild), as illustrated in FIG. 4.

In time t3-t4, the voltages of the input signal 303, net_a0, and net_a1 are already H. Also, the change in voltage of net_a1 from L to H in time t2-t3 propagates with a delay through the BUF 302-1-3 (#2) and the voltage of net_a2 changes from L to H. In response to this change in net_a2, the current i_a1 and the current i_a2 flow to discharge the equivalent capacitance Cp. The current i_a1 corresponds to the low conductance, i.e., the conductance Ga1 (gm1) of the first TR 302-1-1 (#1). The current i_a2 corresponds to the medium conductance, i.e., the conductance Ga2 (gm2) of the first TR 302-1-1 (#2). The time constant with respect to the change in voltage of net_p at this time corresponds to the sum Ga1 (gm1)+Ga2(gm2) of the conductance Ga1 as the low conductance and the conductance Ga2 (gm2) as the medium conductance, and changes from its preceding value to a lower value. That is, the time constant in time t3-t4 is reduced relative to that in time t2-t3 and therefore, the voltage of net_p corresponding to the sum of the currents i_a1 and i_a2 changes at a medium rate, as illustrated in FIG. 4. Also in time t3-t4, since the voltage of net_a0 is already H, the current i_a0 caused by the second TR 302-1-2 to flow is substantially zero.

In time t4-t5, the voltages of the input signal 303, net_a0, net_a1, and net_a2 are H. Also, the change in voltage of net_a2 from L to H in time t3-t4 propagates with a delay through the BUF 302-1-3 (#3) and the voltage of net_a3 changes from L to H. In response to this change in net_a3, the currents i_a1, i_a2 and i_a3 flow to discharge the equivalent capacitance Cp. The current i_a1 corresponds to the low conductance, i.e., the conductance Ga1 (gm1) of the first TR 302-1-1 (#1). The current i_a2 corresponds to the medium conductance, i.e., the conductance Ga2 (gm2). The current i_a3 corresponds to the medium-high conductance, i.e., the conductance Ga3 (gm3). The time constant with respect to the change in voltage of net_p at this time corresponds to Ga1 (gm1)+Ga2(gm2)+Ga3(gm3), and changes from its preceding value to a further reduced value. That is, the time constant in time t4-t5 is further reduced relative to that in time t3-t4 and therefore, the voltage of net_p corresponding to the current i_a1+i_a2+i_a3 changes at a relatively high rate, as illustrated in FIG. 4. Also in time t4-t5, since the voltage of net_a0 is already H, the current i_a0 caused by the second TR 302-1-2 to flow is substantially zero.

In time t5-t6, the voltages of the input signal 303, net_a0, net_a1, net_a2, and net_a3 are H. Also, the change in voltage of net_a3 from L to H in time t4-t5 propagates with a delay through the BUF 302-1-3 (#4) and the voltage of net_a4 changes from L to H. In response to this change in net_a4, the currents i_a1, i_a2, i_a3 and i_a4 flow to discharge the equivalent capacitance Cp. The current i_a1 corresponds to the low conductance, i.e., the conductance Ga1 (gm1) of the first TR 302-1-1 (#1). The current i_a2 corresponds to the medium conductance, i.e., the conductance Ga2 (gm2). The current i_a3 corresponds to the medium-high conductance, i.e., the conductance Ga3 (gm3). The current i_a4 corresponds to the high conductance, i.e., the conductance Ga4 (gm4). The time constant with respect to the change in voltage of net_p at this time corresponds to Ga1 (gm1)+Ga2(gm2)+Ga3(gm3)+Ga4(gm4), and changes from its preceding value to a further reduced value. That is, the time constant in time t5-t6 is further reduced relative to that in time t4-t5 and therefore, the voltage of net_p corresponding to the currents i_a1+i_a2+i_a3+i_a4 changes at a further increased rate, as illustrated in FIG. 4. Also in time t5-t6, since the voltage of net_a0 is already H, the current i_a0 caused by the second TR 302-1-2 to flow is substantially zero.

Figure 4:
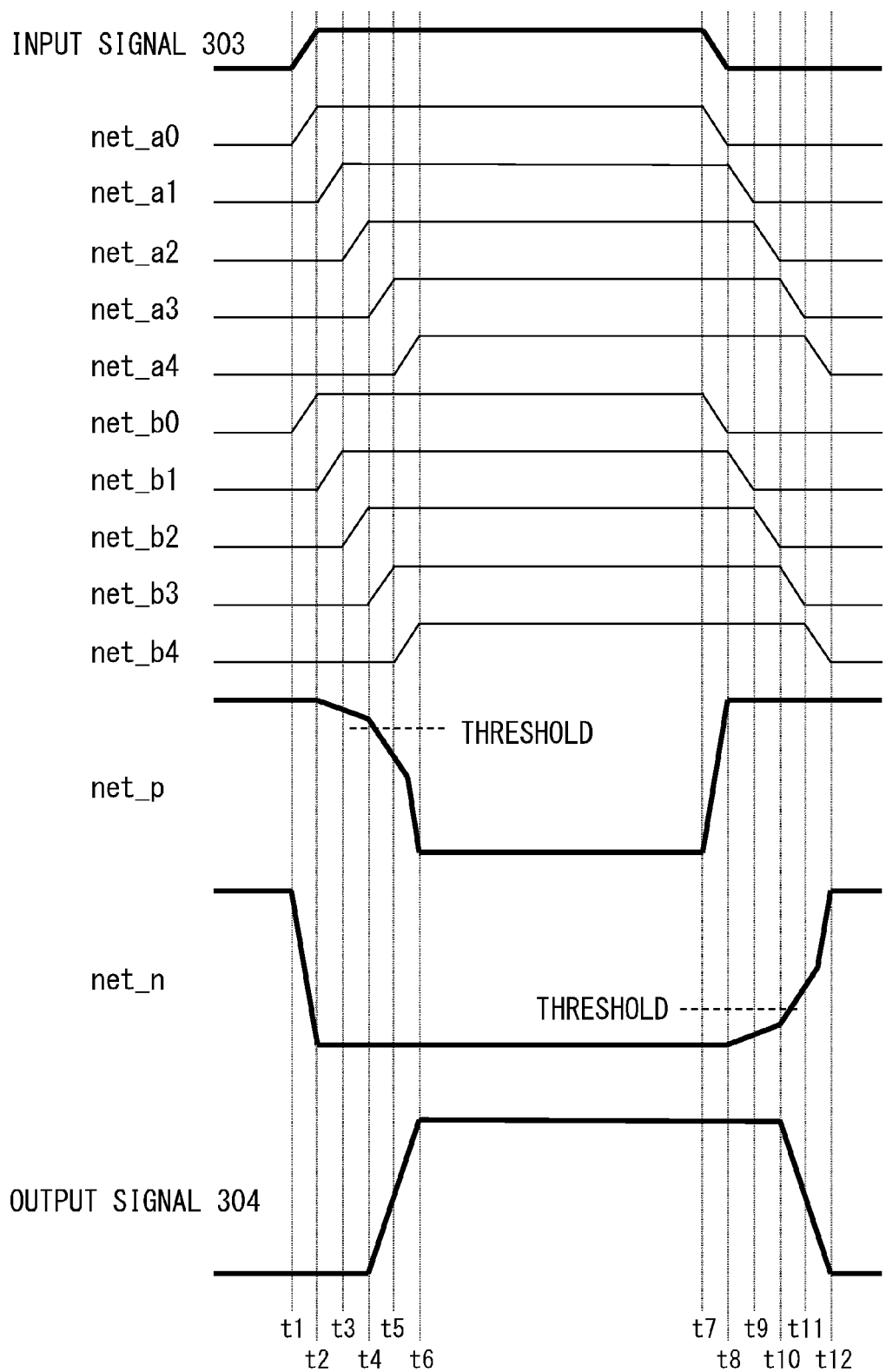
FIG. 4 is a waveform diagram relating to the output driver device according to the first embodiment.

Thus, each term of the total current i_a1+i_a2+i_a3+i_a4 flows with respect to the charge on the equivalent capacitance Cp not indicated in FIG. 4, changes by gradually decreasing from the large initial value, and flows until it becomes zero. When the voltage of net_p corresponding to the change in i_a1+i_a2+i_a3+i_a4 exceeds the threshold (see FIG. 4) of the first driver transistor circuit 301-1 with respect to power supply voltage VDD, the voltage of net_p starts changing under the reduced time constant corresponding to Ga1(gm1)+Ga2(gm2)+Ga3(gm3) and then with the further reduced time constant corresponding to Ga1(gm1)+Ga2(gm2)+Ga3(gm3)+Ga4 (gm4), thus sharpening the waveform of net_p in time t4-t5 and time t5-t6, as illustrated in FIG. 4.

In the time t4-t5 and time t5-t6, the first driver transistor circuit 301-1 becomes on and the voltage of the output signal 304 rises sharply from L to H. At and after time t6, the voltage of net_p is L; the current is zero; and the voltage of the output signal 304 is maintained at H.

Thus, the first TRs 302-1-1 are sequentially turned on from the one having a smaller drive force (conductance) to the one having a larger drive force while the time differences between the TRs are being adjusted by the BUFs 302-1-3, thereby enabling production of a waveform of net_p rounded so as to be convex upward as a whole in the vicinity of the threshold of the first driver transistor circuit 301-1, and not rounded but made sharp in the region exceeding the threshold.

When the input signal 303 falls from H to L in time t7-t8, the current of net_rises sharply like a pulse and falls sharply under the small time constant in time t7-t8 and the voltage of net_p rises sharply under the small time constant, because the conductance of the second TR 302-1-2 is high.

Referring again to FIG. 3, the second pre-driver unit 302-2 is realized in the configuration described below.

A plurality of buffer circuits (BUF) 302-2-3 (#1 to #4) are cascaded. The input signal is fed to the buffer 3-2-3 (#1). The buffers 302-2-3 (#1 to #4) sequentially delay the input signal. Each buffer 302-2-3 is, for example, a CMOS non-inverting circuit. The buffers 302-2-3 respectively output voltage signals net_b1, net_b2, net_b3, and net_b4.

A plurality of first control transistors (first TR) 302-2-1 (#1 to #4) are realized, for example, by p-MOSFETs. Each first TR 302-2-1 has a drain terminal connected to a signal line of the signal net_n and a source terminal connected to power supply voltage VDD.

A second control transistor circuit (second TR) 302-2-2 is, for example, an n-MOSFET. The second TR 302-2-2 has a source terminal connected to ground potential VSS and a drain terminal connected to the signal line of the signal net_n.

The first TRs 302-2-1 (#1 to #4) generate the signal net_n by respectively flowing drain current $i\_b1$, $i\_b2$, $i\_b3$, and $i\_b4$, and $Cn*(dvn/dt)$ based on changes in the voltages of the signals net_b1, net_b2, net_b3, and net_b4. Cn is an equivalent capacitance between the signal line of the signal net_n and ground, and vn is a node voltage satisfying vn=net_n. These values are not indicated in FIG. 3.

Let the voltage of the input signal 303 change from H to L (or from L to H). As a result of this, each of the voltage signal net_bi (i=1, 2, 3, 4) changes from H to L (or from L to H) while being delayed by the propagation delay time of the corresponding buffer circuit 302-2-3 (#1, #2, #3, or #4). Since each first TR 302-2-1 is a p-MOSFET, the drain current i_bi (i=1, 2, 3, 4) flows while increasing (or decreasing) in a linear region of the FET characteristics in response to the change in gate voltage from H to L (or from L to H).

On the other hand, the input signal 303 is directly supplied to the gate terminal of the second TR 302-2-2. Therefore, the drain current i_b0 of the second TR 302-2-2 depends on the difference between the voltage of the input signal 303 and ground potential VSS applied to the source terminal. Since the second TR 302-2-2 is an n-MOSFET, the drain current i_b0 flows while decreasing (or increasing) in a linear region depending on the change in the voltage of the input signal 303 from H to L (or from L to H).

The drain current i_bi is adjusted so as to be larger if the drain-source conductance Gbi and the mutual conductance gmi dependent on the size W/L (width/length) of the channel of the first TRs 302-2-1 or the second TR 302-2-2 are larger. Note that i=0, 1, 2, 3, 4.

Thus, the voltage of the signal net_n depends on the drain currents i_bi (i=1, 2, 3, 4) and Cn*(dvn/dt) flowing through the first TRs 302-2-1 (#1, #2, #3, #4). The voltage of the signal net_n also depends on the drain current i_b0 flowing through the second TR 302-2-2. Further, the voltage of the signal net_n also depends on Gbi or gmi (hereinafter referred to as "Gbi (gmi)") of each first TR 302-2-1 or the second TR 302-2-2.

A current law $i\_b0 = i\_b1 + i\_b2 + i\_b3 + i\_b4 - Cn*(dvn/dt)$ is established at any time t in the linear region. The size of the channel of each first TR 302-2-1 is adjusted so that the following expression is satisfied.

$$Gb1(gm1) < Gb2(gm2) < Gb3(gm3) < Gb4(gm4)$$

and $$Gb0(gm0) >> Gb1gm1) + Gb2(gm2) + Gb3(gm3) + Gb4(gm4)$$

Based on this relationship, the first TRs 302-2-1 are sequentially turned on from the first TR 302-2-1 having a lower conductance, i.e., W/L, as a drive force to the first TR 302-2-1 having a larger drive force while the time differences therebetween are being adjusted by the BUFs 302-2-3, thereby adjusting the waveform of the signal net_n. Thus, it is possible to form a waveform rounded in the vicinity of the threshold of the output driver, while forming a waveform not rounded within a region exceeding the threshold, i.e., a sharp waveform.

The above operation will be described with reference to the waveform diagram of FIG. 4.

The equivalent capacitance Cn as seen toward the second pre-driver unit 302-2 side from the gate terminal of the second driver transistor circuit 301-2 to which the signal net_n is fed changes depending on the operating regions of the first TRs 302-2-1 and the second TR 302-2-2. However, for ease of description, it is assumed that the equivalent capacitance Cn is substantially constant between the gate of the second driver transistor circuit 301-2 and ground (VSS). Then, if the total conductance G is higher, the time constant (Cn/G) with respect to changes in the total conductance G is smaller and the response of the signal net_n is higher.

First, when the input signal 303 rises from L to H in time t1-t2, the current of net_n rises sharply like a pulse and falls sharply under a small time constant and the voltage of net_n falls sharply under the small time constant, because the conductance of the second TR 302-2-2 is high.

Next, in time t7-t8, the voltage of the input signal 303 changes from H to L and the voltage of the signal net_b0 also changes from H to L. In this time section, the voltage signals net_b1, net_b2, net_b3, and net_b4 are H. Therefore, the L-level voltage held on the equivalent capacitance Cn is the voltage of net_n.

In time t8-t9, the change in the voltage of net_b0 from H to L in time t7-t8 propagates with a delay through the BUF 302-2-3 (#1) and the voltage of net_b1 changes from H to L. Also, in time t8-t9, the voltages of the input signal 303 and net_b0 are already L. In response to this change in net_b1, the current i_b1 corresponding to the low conductance, i.e., the conductance Gb1 (gm1) of the first TR 302-2-1 (#1), flows to charge the equivalent capacitance Cn. Since in time t8-t9 the voltage of net_b0 is L, i_b0 in the second TR 302-2-2 is substantially zero. Also, the time constant for net_n based on the first TR 302-2-1 (#1) is large because of the low conductance Gb1 (gm1). The voltage waveform of net_n in time t8-t9 changes slowly (the slope is mild), as illustrated in FIG. 4.

In time t9-t10, the voltages of the input signal 303, net_b0, and net_b1 are already L. Also, the change in voltage of net_b1 from H to L in time t8-t9 propagates with a delay through the BUF 302-2-3 (#2) and the voltage of net_b2 changes from H to L. In response to this change in net_b2, the current i_b1 and the current i_b2 flow to charge the equivalent capacitance Cn. The current i_b1 corresponds to the low conductance, i.e., the conductance Gb1 (gm1) of the first TR 302-2-1 (#1). The current i_b2 corresponds to the medium conductance, i.e., the conductance Gb2 (gm2) of the first TR 302-2-1 (#2). The time constant with respect to the change in voltage of net_n at this time corresponds to the sum Gb1 (gm1)+Gb2 (gm2) of the low conductance Gb1 and the medium conductance Gb2 (gm2), and changes from its preceding value to a lower value. That is, the time constant in time t9-t10 is reduced relative to that in time t8-t9 and therefore, the voltage of net_n corresponding to the sum of the currents i_b1 and i_b2 starts changing at a medium rate, as illustrated in FIG. 4. Also in time t9-t10, since the voltage of net_b0 is already L, the current i_b0 caused by the second TR 302-2-2 to flow is substantially zero.

In time t10-t11, the voltages of the input signal 303, net_b0, net_b1, and net_b2 are L. Also, the change in voltage of net_b2 from H to L in time t9-t10 propagates with a delay through the BUF 302-2-3 (#3) and the voltage of net_b3 changes from H to L. In response to this change in net_b3, the currents i_b1, i_b2, and i_b3 flow to charge the equivalent capacitance Cn. The rate of the current i_b1 corresponds to the low conductance, i.e., the conductance Gb1 (gm1) of the first TR 302-2-1 (#1). The rate of the current i_b2 corresponds to the medium conductance, i.e., the conductance Gb2 (gm2). The rate of the current i_b3 corresponds to the medium-high conductance, i.e., the conductance Gb3 (gm3). The time constant with respect to the change in voltage of net_n at this time corresponds to Gb1 (gm1)+Gb2(gm2)+Gb3(gm3), and changes from its preceding value to further reduced value. That is, the time constant in time t10-t11 is reduced relative to that in time t9-t10 and therefore, the voltage of net_n corresponding to the current i_b1+i_b2+i_b3 changes at a higher rate, as illustrated in FIG. 4. Also in time t10-t11, since the voltage of net_b0 is already L, the current i_b0 caused by the second TR 302-2-2 to flow is substantially zero.

In time t11-t12, the voltages of the input signal 303, net_b0, net_b1, net_b2, and net_b3 are L. Also, the change in voltage of net_b3 from H to L in time t10-t11 propagates with a delay through the BUF 302-2-3 (#4) and the voltage of net_b4 changes from H to L. In response to this change in net_b4, the currents i_b1, i_b2, i_b3 and i_b4 flow to charge the equivalent capacitance Cn. The rate of the current i_b1 corresponds to the low conductance Gb1 (gm1) of the first TR 302-2-1 (#1). The rate of the current i_b2 corresponds to the medium conductance Gb2 (gm2). The rate of the current i_b3 corresponds to the medium-high conductance Gb3 (gm3). The rate of the current i_b4 corresponds to the high conductance Gb4 (gm4). The time constant with respect to the change in voltage of net_n at this time corresponds to Gb1 (gm1)+Gb2(gm2)+Gb3(gm3)+Gb4(gm4), and changes from its preceding value to a further reduced value. That is, the time constant in time t11-t12 is further reduced relative to that in time t10-t11 and, therefore, the voltage of net_n corresponding to the current i_b1+i_b2+i_b3+i_b4 changes at a further increased rate, as illustrated in FIG. 4. Also in time t11-t12, since the voltage of net_b0 is already L, the current i_b0 caused by the second TR 302-2-2 to flow is substantially zero.

Thus, each term of the total currents i_b1+i_b2+i_b3+i_b4 flows according to the change in the charge on the equivalent capacitance Cn not indicated in FIG. 4, changes by gradually decreasing from large initial value, and flows until it becomes zero. When the voltage of net_n corresponding to the change in i_b1+i_b2+i_b3+i_b4 exceeds the threshold (see FIG. 4) of the second driver transistor circuit 301-2 with respect to ground potential VSS, the voltage of net_n changes with the reduced time constant, thus sharpening the waveform of net_n in time t10-t11 and time t11-t12, as illustrated in FIG. 4.

In the time section t10-t12, the second driver transistor circuit 301-2 becomes on and the voltage of the output signal 304 falls sharply from H to L. After time t12, the voltage of net_n is H; the current is zero; and the voltage of the output signal 304 is maintained at L.

Thus, the first TRs 302-2-1 are sequentially turned on from the one having a smaller drive force (conductance) to the one having a larger drive force while the time differences therebetween are being adjusted by the BUFs 302-2-3. Accordingly, the output driver generates a waveform of net_n rounded so as to be concave downward as a whole in the vicinity of the threshold of the second driver transistor circuit 301-2, and not rounded but sharp in the region exceeding the threshold.

Thus, as illustrated in FIGS. 3 and 4, turn-off of the driver transistor circuit 301-2 caused by the sharp fall of net_n is performed prior to turn-on of the driver transistor circuit 301-1 caused by the fall of net_p.

Also, turn-off of the driver transistor circuit 301-1 caused by the sharp rise of net_p is performed prior to turn-on of the driver transistor circuit 301-2 caused by the rise of net_n.

FIG. 5 is a diagram illustrating the effects of the waveform signals generated by the first embodiment illustrated in FIG. 3.

It is assumed here that as illustrated in FIG. 5, the input signal 303 rises from time t1 to time t2 and falls from time t7 to time t8.

Changes in the output signal generated in response to the changes in the input signal 303 in the case of the conventional art are as indicated by the broken line in FIG. 5. That is, when the input signal 303 rises, a signal rounded from time t1 to time t6 is generated. Also, when the input signal 303 falls, an output signal changed by being rounded from time t7 to time t12 is generated.

On the other hand, in the first embodiment illustrated in FIG. 3, the output signal is as indicated by the solid line in FIG. 5. That is, the output signal rises little from t1 to t4, rises substantially from t4 to t5, and rises sharply from t5 to t6. Also, the output signal falls little from t7 to t10, falls substantially from t10 to t11, and falls sharply from t11 to t12. Thus, in the first embodiment, the rise and fall of the output signal are sharp and the switching characteristics of the driver transistors are improved in speed.

Current noise is represented by a differential value di/dt of a through current i. A through current and a differential value of the through current, i.e., current noise, when the output voltage rises or falls are large in the case of the conventional art, as indicated by the broken line in FIG. 5. In contrast, in the first embodiment, such current noise and a through current are reduced, as indicated by the solid line. The through current between t5 and t9 is constant because the output signal 104 (current) flows between the driver transistors and the load.

Thus, in the first embodiment illustrated in FIG. 3, the first pre-driver unit 302-1 and the second pre-driver unit 302-2 control the signal net_p and the signal net_n. As a result, a turn-on signal (net_p) and a turn-off signal (net_n) rounded only in the vicinities of the thresholds of the first driver transistor circuit 301-1 and the second driver transistor circuit 301-2 are generated, thereby enabling high-speed operation in the external switching operation while suppressing generation of noise.

According to the above-described first related art, the entire waveforms of the driver control signals are rounded. Therefore, the output waveform is also rounded. This is a hindrance to the realization of high-speed low-power-consumption operation. In contrast, in the first embodiment illustrated in FIG. 3, noise can be effectively reduced by controlling portions of the waveforms in the vicinity of the threshold voltage of the driver transistor circuit which have a large influence on noise generation. Also, portions of the waveforms other than the vicinity of the threshold voltages which have a limited influence on noise generation are rapidly changed, thus rounding of the output waveform can be limited. As a result, in the first embodiment, high-speed operation can be realized while limiting the generation of noise and power consumption.

Figure 1A:
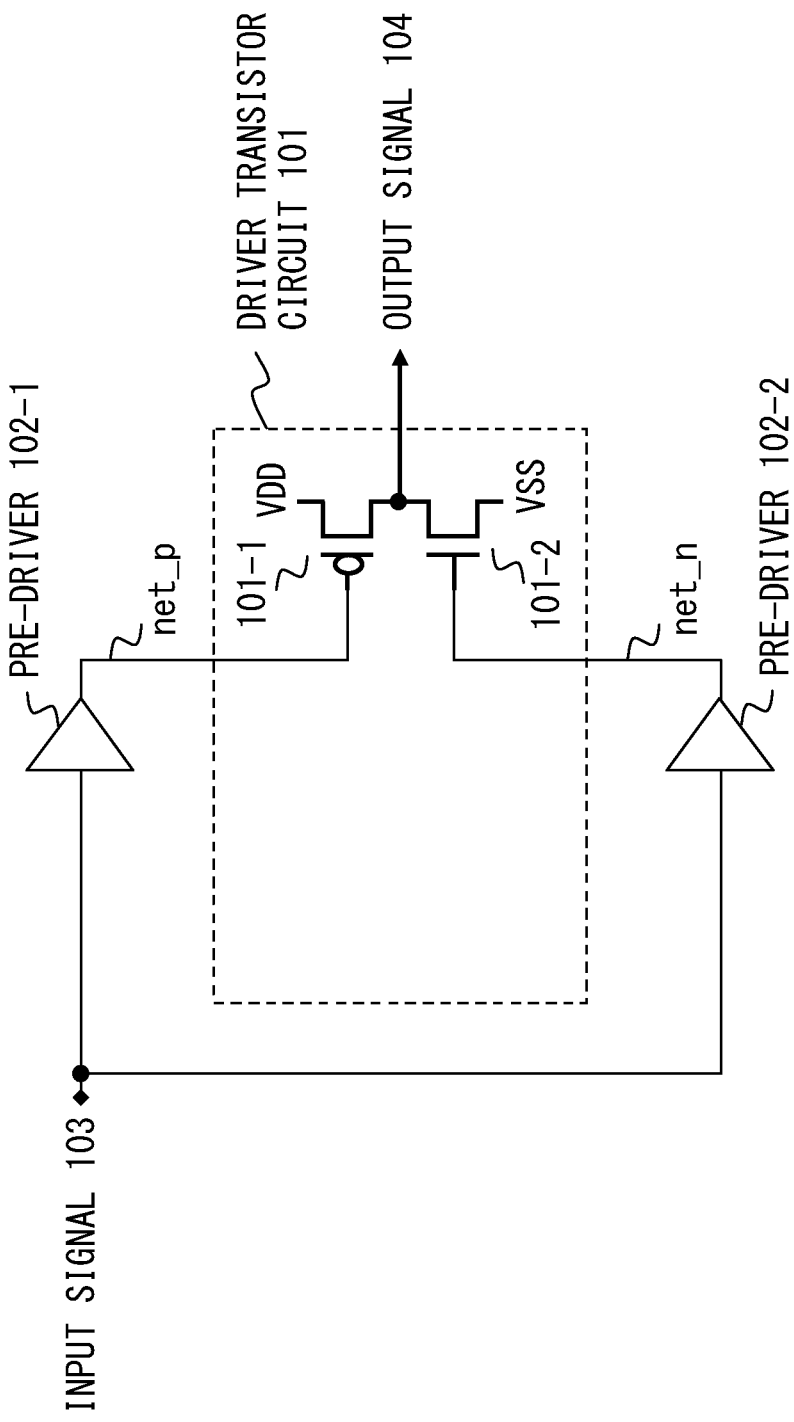
FIG. 1A illustrates a configuration of an output driver and a peripheral circuit.
Figure 1:
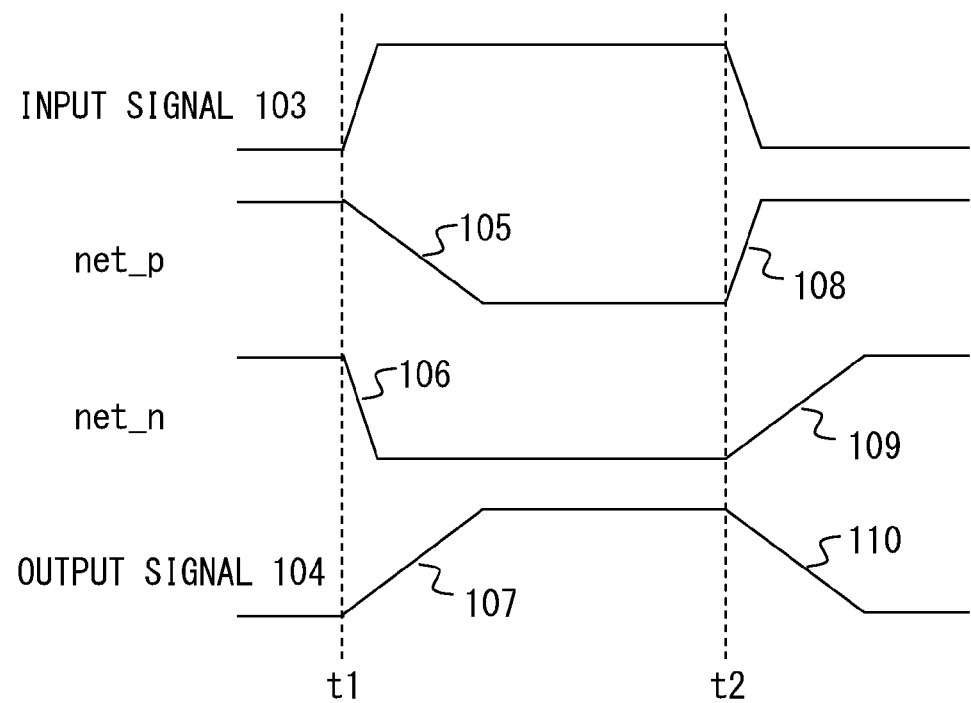
FIG. 1B is a waveform diagram of a control method according to a first related art.
Figure 2A:
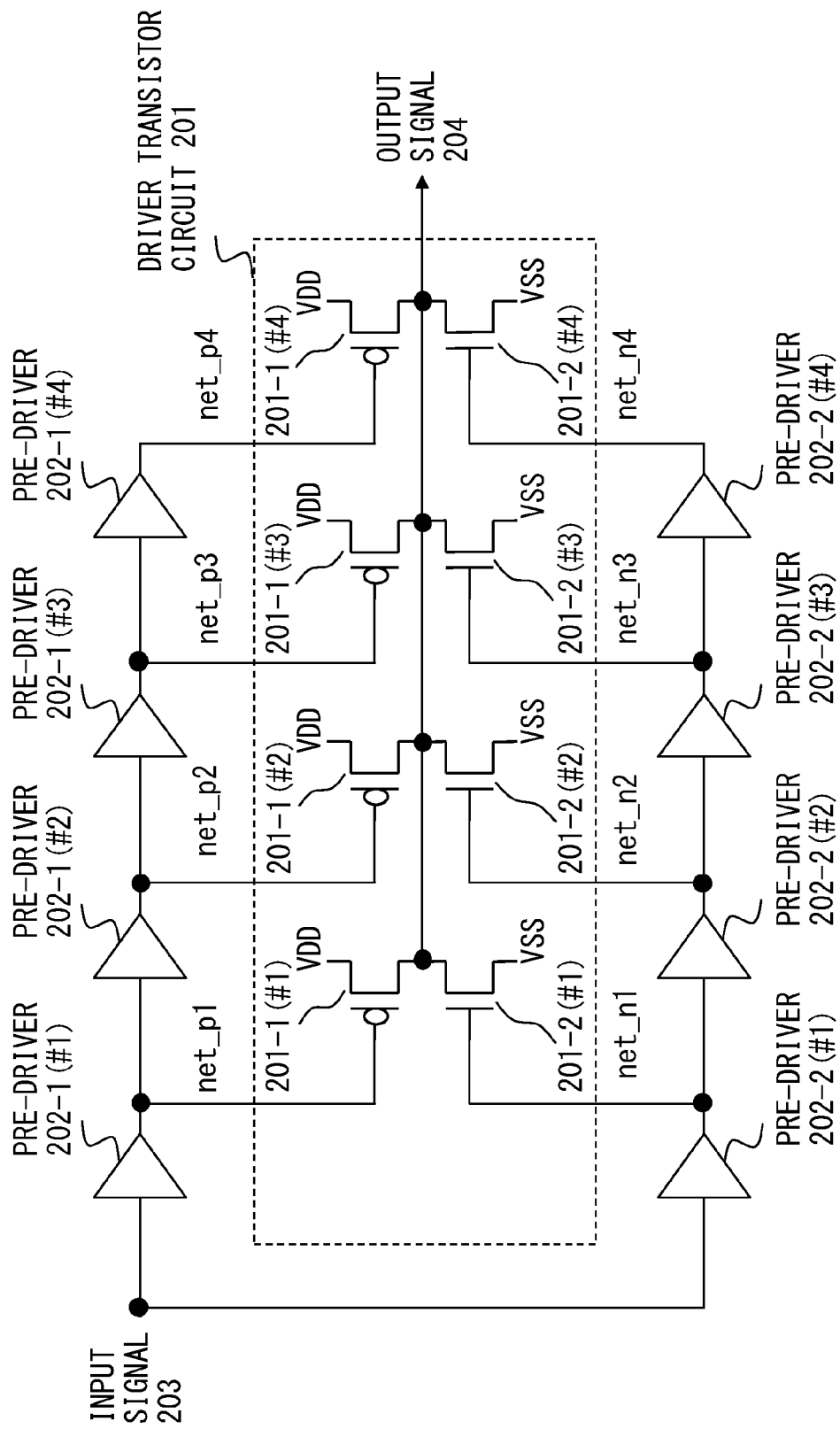
FIG. 2A illustrates a configuration according to a second related art.
Figure 2B:
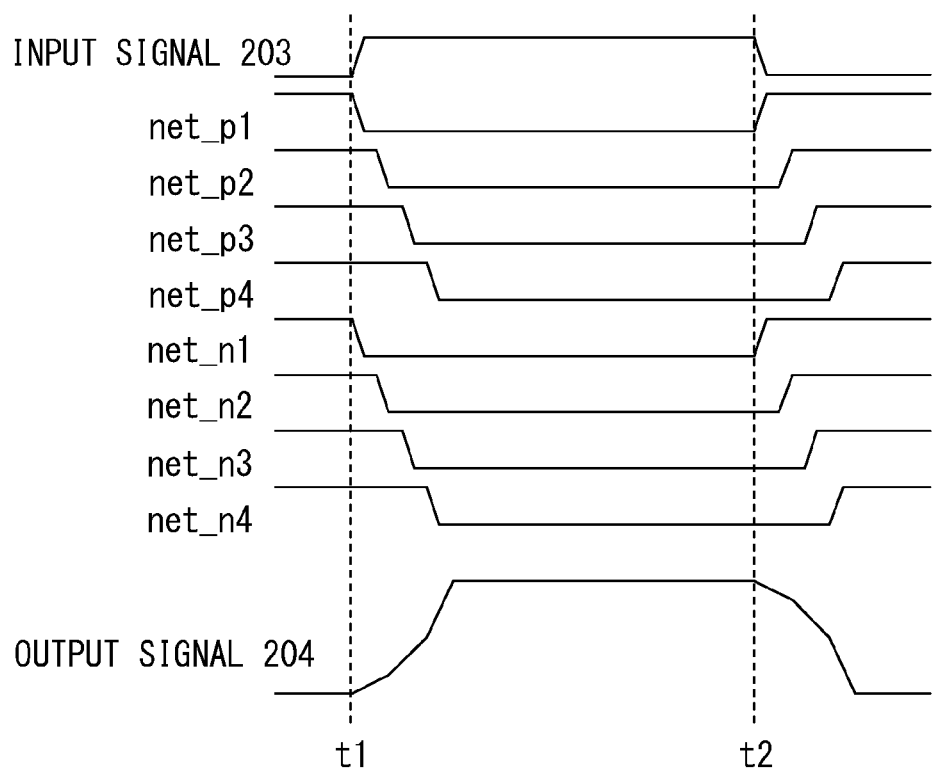
FIG. 2B is a waveform diagram according to the second related art.

A comparison between the first embodiment and the above-described second related art will be made. The second related art requires a plurality of pairs of p-MOSFETs 201-1 and n-MOSFETs 201-2 as the driver transistor circuit 201 in order to control the output waveform as illustrated in FIG. 2. In general, a driver transistor circuit needs a large mount area on an LSI because of the need to produce a large-output turn-on and turn-off signals. For example, in the case of the second related art, as schematically illustrated in FIG. 12A, the mount area for a section for a driver transistor circuit 1201 relative to those for pre-driver units 1202-1 and 1202-2 is large. Also, the wiring between the pre-driver units 1202-1 and 1202-2 and the driver transistor circuit 1201 may be complicated. The driver transistor circuit 1201 in FIG. 12A corresponds to the driver transistor circuit 201 in FIG. 2. The pre-driver units 1202-1 and 1202-2 in FIG. 12A correspond to the pre-drivers 202-1 (#1 to #4) and pre-drivers 202-2 (#1 to #4) in FIG. 2.

In contrast, the configuration in the first embodiment is such that only one pair of driver transistor circuits 301-1 and 301-2 illustrated in FIG. 3 is provided, and the number of elements is increased in the first pre-driver unit 302-1 and the second pre-driver unit 302-2. The output of the signal net_p and signal net_n is much smaller than the output of the turn-on signal and the turn-off signal as the output signal 304. Therefore, the mount area for the elements necessary for the first pre-driver unit 302-1 and the second pre-driver unit 302-2 can be reduced. Thus, the mount area on an LSI for the output driver device in the first embodiment can be reduced relative to that for the output driver device in the case of the second related art. That is, for example, as schematically illustrated in FIG. 12B, only one pair of driver transistor circuits is provided as the driver transistor circuit 1203. The mount area for the driver transistor circuit 1203 is smaller than that for the driver transistor circuit 1201 in FIG. 12A. A smaller mount area is also obtained for pre-driver units 1204-1 and 1204-2. The driver transistor circuit 1203 in FIG. 12B corresponds to the driver transistor circuit 301 in FIG. 3. The pre-driver units 1204-1 and 1204-2 in FIG. 12B correspond to the first pre-driver unit 302-1 and the second pre-driver unit 302-2 in FIG. 3.

Figure 6:
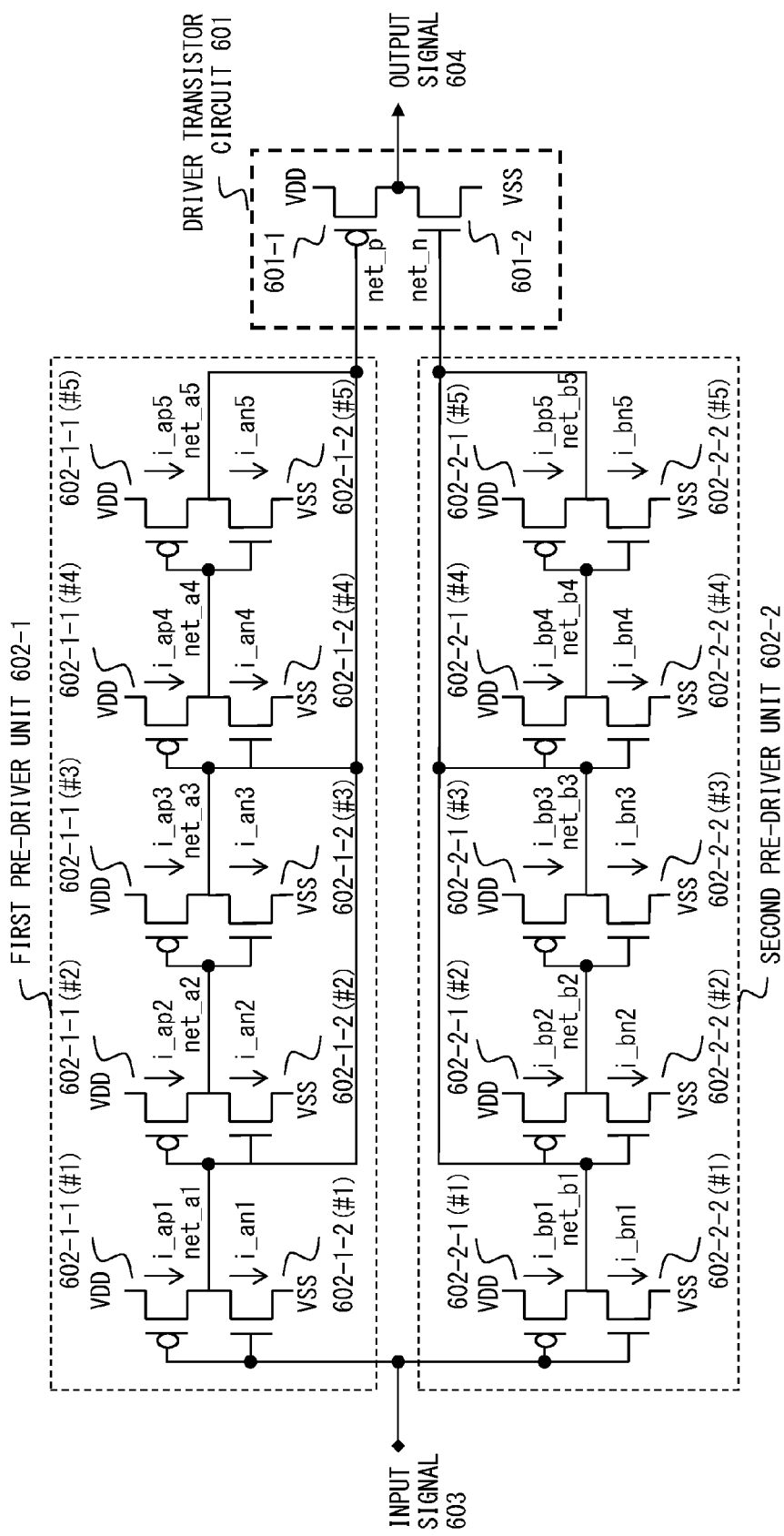
FIG. 6 illustrates a configuration of an output driver device according to a second embodiment.

FIG. 6 illustrates a configuration of an output driver device according to a second embodiment.

The output driver illustrated in FIG. 6 is disposed in an output section in an LSI and generates an output signal 604 for controlling turn-on/turn-off of a switching element externally connected, based on on/off of an input signal 603 generated in the LSI.

Referring to FIG. 6, a driver transistor circuit 601 includes a p-MOSFET 601-1, which is a first driver transistor circuit, and an n-MOSFET 601-2, which is a second driver transistor circuit. The configuration and the operation of the driver transistor circuit 601 are substantially the same as those of the driver transistor circuit 301 illustrated in FIG. 3, which can be realized by the p-MOSFET 301-1 and the n-MOSFET 301-2.

The first driver transistor circuit 601-1 is controlled by a signal net_p generated from a first pre-driver unit 602-1. The second driver transistor circuit 601-2 is controlled by a signal net_n generated from a second pre-driver unit 602-2.

In FIG. 6, the first pre-driver unit 602-1 can be realized in the configuration described below.

The first pre-driver unit 602-1 can be realized, for example, by CMOS inverter circuits in a plurality of stages cascaded to sequentially delay an input signal. The input signal 603 is supplied to the first stage CMOS inverter circuit (#1). The inverter circuit in each stage is realized by a first control transistor (first TR) 602-1-1 (#1, #2, #3, #4, or #5), which is, for example, a p-MOSFET, and a second control transistor (second TR) 602-1-2 (#1, #2, #3, #4, or #5), which is, for example, an n-MOSFET.

Power supply voltage VDD is applied to the source terminals of the first TRs 602-1-1 (#1 to #5), while the source terminals of the second TRs 602-1-2 (#1 to #5) are grounded to ground potential VSS. In each of the stages #1 to #5, the gate terminals of the first TR 602-1-1 and the second TR 602-1-2 are connected together to form an input terminal, and the drain terminals of the first TR 602-1-1 and the second TR 602-1-2 are connected together to form an output terminal, which is connected to the input terminal of the next stage.

The drive currents of the first TRs 602-1-1 (#1 to #5) are i_ap1, i_ap2, i_ap3, i_ap4 and i_ap5, respectively. The drive currents of the second TRs 602-1-2 (#1 to #5) are i_an1, i_an2, i_an3, i_an4 and i_an5, respectively. The currents i_ap1 and i_an1 are controlled by the input signal 603 applied to the input terminal (gate terminals) of the first TR 602-1-1 (#1) and the second TR 602-1-2 (#1) in the first stage to generate an output voltage signal net_a1. The currents i_ap2 and i_an2 are controlled by the signal net_a1 applied to the input terminal of the first TR 602-1-1 (#2) and the second TR 602-1-2 (#2) in the second stage to generate an output voltage signal net_a2. The currents i_ap3 and i_an3 are controlled by the signal net_a2 applied to the input terminal of the first TR 602-1-1 (#3) and the second TR 602-1-2 (#3) in the third stage to generate an output voltage signal net_a3. The currents i_ap4 and i_an4 are controlled by the signal net_a3 applied to the input terminal of the first TR 602-1-1 (#4) and the second TR 602-1-2 (#4) in the fourth stage to generate an output voltage signal net_a4. The currents i_ap5 and i_an5 are controlled by the signal net_a4 applied to the input terminal of the first TR 602-1-1 (#5) and the second TR 602-1-2 (#5) in the fifth stage to generate an output voltage signal net_a5.

The input signal 603 is supplied to an input terminal of the first TR 602-1-1 (#1) and the second TR 602-1-2 (#1) in the first stage. The inverter circuit including the first TR 602-1-1 (#i) and the second TR 602-1-2 (#i) (i=1, 2, 3, 4, 5) in each stage sequentially delay the signal.

The inverter output voltage signals from odd-numbered or even-numbered stages, e.g., net_a1, net_a3, and net_a5 from odd stages: the first, third and fifth stages are equivalent to the signal net_p. In this case, the following relation in voltages is obtained.

net_p=net_a1=net_a3=net_a5.

Let the input signal 603 change from L to H (or from H to L). As a result of this, each signal net_ai (i=1, 2, 3, 4, 5) changes from L to H or from H to L by being inverted by the inverter circuit in the corresponding stage (the pair of first TR 602-1-1 (#i) and second TR 602-1-2 (#i)) while being delayed by the corresponding propagation delay time. Since each first TR 602-1-1 is a p-MOSFET, the drain current i_api (i=1, 2, 3, 4, 5) flows while decreasing (or increasing) in a linear region of the FET characteristics in response to the change in the gate voltage from L to H (or from H to L). Also, since each second TR 602-1-2 is an n-MOSFET, the drain current i_ani (i=1, 2, 3, 4, 5) flows while increasing (or decreasing) in a linear region of the FET characteristics in response to the change in the gate voltage from L to H (or from H to L). Note that i=1, 2, 3, 4, 5.

The drain current i_api is adjusted so as to be larger if the drain-source conductance Gapi and the mutual conductance gmpi dependent on the size W/L of the channel of the first TR 602-1-1 are larger. Similarly, the drain current i_ani is adjusted so as to be larger if the drain-source conductance Gani and the mutual conductance gmni dependent on the size W/L of the channel of the second TR 602-1-2 are larger. Note that i=0, 1, 2, 3, 4, 5.

Thus, the voltage of the signal net_p depends on the drain currents i_api and i_ani (i=1, 3, 5) flowing through the first TRs 602-1-1 and the second TRs 602-1-2 (#1, #3, #5). The signal net_p also depends on Cp*(dvp/dt). Cp is an equivalent capacitance between the signal line of the signal net_p and ground, and vp is a node voltage satisfying vp=net_p. These values are not indicated in FIG. 6. Further, the voltage of the signal net_p also depends on the conductances Gapi or gmpi (hereinafter referred to as "Gapi (gmpi)") and Gani or gmni (hereinafter referred to as "Gani (gmni)") (i=1, 3, 5) of the first TRs 602-1-1 (#1, #3, #5) and the second TRs 602-1-2 (#1, #3, #5).

A current law as follows is established at any time t.

Cp*(dvp/dt)=i_a1+i_a3+i_a5 i_a1=i_ap1−i_an1 i_a3=i_ap3−i_an3 i_a5=i_ap5−i_an5

The size of the channel of each of the first TRs 602-1-1 and the second TRs 602-1-2 is adjusted so that the following expression is satisfied.

Gap1(gmp1)>Gap3>(gmp3)>Gap5(gmp5)

and

Gan1(gmn1)<Gan3(gmn3)<Gan5(gmn5)

and

Gap1(gmp1)>>Gan3(gmn3)+Gan5(gmn5)

According to this relationship, the second TRs 602-1-2 in the odd stages are sequentially turned on from the one having a smaller drive force (conductance) to the one having a larger drive force in response to a rise of the input signal 603 from L to H. Also, the first TRs 602-1-1 in the odd stages are sequentially turned off from the one having a larger drive force to the one having a smaller drive force. Simultaneously, the time differences between signal propagations in the stages are adjusted by an inverter circuit configuration including the pairs of the first TRs 602-1-1 and the second TRs 602-1-2 in the stages, thereby adjusting the waveform of the signal net_p. Thus, it is possible to form a waveform rounded in the vicinity of the threshold of the output driver transistor circuit 601-1 so that the waveform is convex upward, while forming a waveform not rounded within a region exceeding the threshold, i.e., a sharp waveform.

The above operation will be described with reference to the waveform diagram of FIG. 7.

The equivalent capacitance Cp as seen toward the first pre-driver unit 602-1 side from the gate terminal of the first driver transistor circuit 601-1 to which the signal net_p line is fed changes depending on the operating regions of the first TRs 602-1-1 and the second TRs 602-1-2. However, for ease of description, it is assumed that the equivalent capacitance Cp is substantially constant between the gate of the first driver transistor circuit 601-1 and ground (VSS). Then, if the total conductance G is higher, the time constant (Cp/G) with respect to changes in the total conductance G is smaller and the response of the signal net_p is higher. It is assumed here that the circuit illustrated in FIG. 6 operates in accordance with a small-signal equivalent model in a transient state. Under this assumption, the total conductance G is the sum of the conductances Gapi (gmpi) and Gani (gmni) (i=1, 3, 5) of the first TRs 602-1-1 (#1, #3, #5) and the second TRs 602-1-2 (#1, #3, #5). However, the description of the operation will be made only with respect to Gani (gmni) (i=1, 3, 5) for ease of description.

In the following description, for example, a time section from t1 to t2 is referred to time t1-t2, a time section from t2 to t3 is referred to time t2-t3 and so on.

First, in time t1-t2, the voltage of the input signal 603 changes from L to H. In this time section, while the voltage of net_a1 starts changing from H to L while being inverted, the voltage of net_a2 to net_a5 are still not changed. FIG. 7 illustrates current waveforms. In time t1-t2, i_ap1=0 and i_an1 starts increasing. Since the first TRs 602-1-1 (#3, #5) are p-MOSFETs and the gate voltages thereon are still L, the state of each of the first TRs 602-1-1 (#3, #5) is close to the on state. Therefore, i_ap3 and i_ap5 start increasing. In time T1-t2, the H level of the voltage held by the equivalent capacitance Cp is the voltage of the signal net_p. Also in time t1-t2, i_ap1 is L (=0) because the gate voltage on the first TR 602-1-1 (#1) is H. Before t12, the first TRs 602-1-1 (#1, #3, #5), which are p-MOSFETs, are in the on state because the gate voltages on the first TRs 602-1-1 are L, while the each of i_ap1, i_ap3 and i_ap5 is maintained at L (=0) because the signal net_p is H. Then, in time t1-t2, the first TR 602-1-1 (#1), which is a p-MOSFET, is turned off due to the change from L to H in the input signal 603, and the i_ap1 is maintained at L. On the other hand, the first TRs 602-1-1 (#3, #5) are maintained in the on state even in time t1-t2 because of delayed propagation. In response to a start of falling of the voltage of the signal net_p in time t1-t2, the current i_ap3 and i_ap5 start increasing.

In time t2-t3, t3-t4, t4-t5, the voltage of the input signal 603 is already H. Thus, i_an1, i_an3, and i_an5 start increasing in this order in the time t2-t3, t3-t4, and t4-t5, respectively. In response to these changes, the second TRs 602-1-2 (#1, #3, #5) operate according to the respective conductances Gani (gmni) (i=1, 3, 5), as described below. First, the currents i_ani (i=1, 3, 5) flow to discharge the equivalent capacitance Cp. At this time, since the first TRs 602-1-1 (#3, #5) are still on, the currents i_ap3 and i_ap5 flow to charge the equivalent capacitance Cp. The equivalent capacitance Cp is already charged and therefore, no charge current flows. Eventually, according to the relationship with the currents i_ani (i=1, 3, 5), a current flows to discharge the equivalent capacitance Cp, and the voltage of the signal net_p falls.

In time t2-t3, the change in voltage of the input signal 603 from L to H in time t1-t2 propagates while being delayed and inverted through the inverter circuit including the first TR 602-1-1 (#1) and the second TR 602-1-2 (#1), and the voltage of net_a1 changes from H to L. In response to this change, in the signal net_p, the currents i_ap3 and i_ap5 flowing in direct current in this time section through the first TRs 602-1-1 (#3, #5) in the on state are added to the current i_ant.

Since the currents i_an1, i_ap3 and i_ap5 may flow simultaneously with each other for a certain time period, there is a possibility of failure to invert net_p depending on the difference between i_an1 and i_ap3+i_ap5. Thus, it is necessary to make adjustment for enabling turn-on of the p-channel transistor through which i_ap2 is caused to flow, by paying attention to the balance between these currents.

As a result of this, a current flows to discharge the equivalent capacitance Cp to form the signal net_p as a voltage signal. The rate of the current i_an1 corresponds to the low conductance, i.e., the conductance Gan1 (gmn1) of the second TR 602-1-2 (#1). The time constant with respect to the change in voltage of the signal net_p at this time corresponds to the low conductance Gan1 (gmn1). As a result, in time t2-t3, the gradient of the change in current i_an1 is low and the gradient of the change in the voltage waveform of the signal net_p is also low, as illustrated in FIG. 7. In time t2-t3, the gate voltages on the first TRs 602-1-1 (#3, #5), p-MOSFETs, are L. Therefore, i_ap3 and i_ap5 increases in response to the fall in voltage of the signal net_p. Also in time t2-t3, the first TR 602-1-1 (#1), a p-MOSFET, has the gate voltage set to H and maintains the off state and therefore, the value of i_ap1 is maintained at L (=0).

Figure 7:
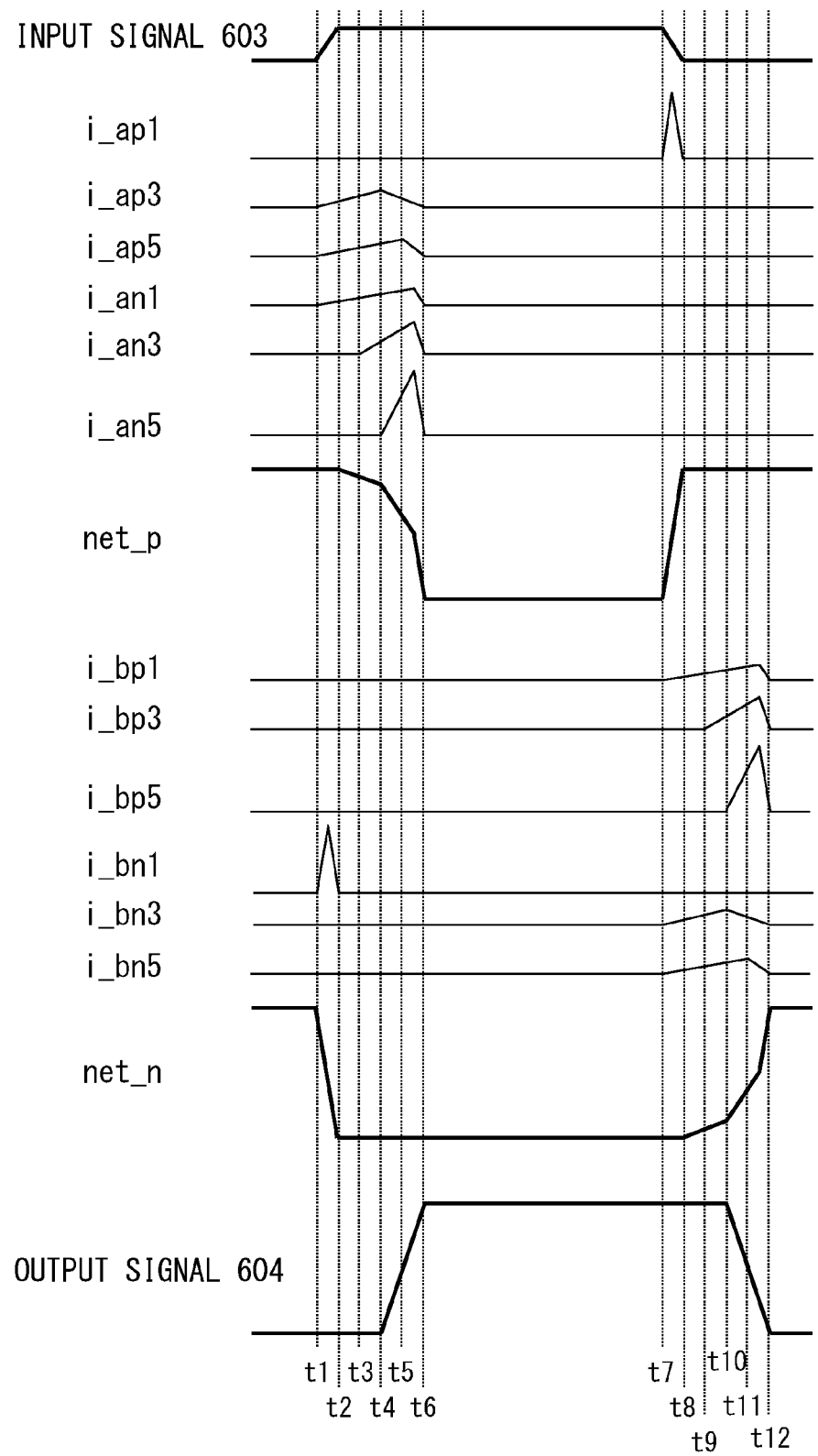
FIG. 7 is a waveform diagram relating to the output driver device according to the second embodiment.

In time t3-t4, the voltage of the input signal 603 is already H and the voltage of net_a1, not indicated in FIG. 7, is already L after being inverted. The change in voltage of net_a1 from H to L in time t2-t3 propagates while being delayed and inverted through the inverter circuit of the first TR 602-1-1

(#2) and the second TR 602-1-2 (#2), and the voltage of net_a2 changes from L to H. In response to this change in net_a2, the currents i_ap3 and i_ap5 flowing through the first TRs 602-1-1 (#3, #5) in the on state are added to the current i_an1 and the current i_an3. As a result, a current flows to discharge the equivalent capacitance Cp. The rate of the current i_an1 corresponds to the low conductance, i.e., the conductance Gan1 (gmn1) of the second TR 602-1-2 (#1). The rate of the current i_an3 corresponds to the medium conductance, i.e., the conductance Gan3 (gmn3) of the second TR 602-1-2 (#3). The time constant with respect to the change in voltage of the signal net_p at this time corresponds to the sum Gan1(gmn1)+Gan3(gmn3) of the low conductance Gan1 (gmn1) and the medium conductance Gan3 (gmn3). Therefore, the time constant with respect to the change in voltage of the signal net_p changes from its preceding value to a lower value. That is, the time constant in time t3-t4 is reduced relative to that in time t2-t3 and therefore, the voltage of the signal net_p corresponding to the sum of the currents i_an1 and i_an3 changes at a medium rate, as illustrated in FIG. 7. Also in time t3-t4, the gate voltages on the first TRs 602-1-1 (#3, #5), p-MOSFETs, are L. Therefore, i_ap3 and i_ap5 continue increasing in response to the fall in voltage of the signal net_p. Also in time t3-t4, the first TR 602-1-1 (#1), a p-MOSFET, has the gate voltage set to H and maintains the off state and therefore, the value of i_ap1 is maintained at L (=0).

In time t4-t5, the voltage of the input signal 603 is H, the voltage of net_a1 is L, and the voltage of net_a2 is H. The change in voltage of net_a2 from L to H in time t3-t4 propagates while being delayed and inverted through the inverter circuit of the first TR 602-1-1 (#3) and the second TR 602-1-2 (#3), and the voltage of net_a3 changes from H to L. Further, after the lapse of the delay time, net_a4 also starts changing from L to H. In response to this, the currents i_an1, i_an3, and i_an5 flow to discharge the equivalent capacitance Cp. At this time, i_ap3 changes toward L (=0) due to the signal net_a2 changing from L to H. However, the gate voltage on the first TR 602-1-1 (#5) is in a state immediately after starting increasing and therefore, the value of i_ap5 still continues increasing. The rate of the current i_an1 corresponds to the low conductance, i.e., the conductance Gan1 (gmn1) of the second TR 602-1-2 (#1). The rate of the current i_an3 corresponds to the medium conductance, i.e., the conductance Gan3 (gmn3) of the second TR 602-1-2 (#3). The rate of the current i_an5 corresponds to the maximum conductance, i.e., the conductance Gan5 (gmn5) of the second TR 602-1-2 (#5). The time constant with respect to the change in voltage of the signal net_p at this time corresponds to the sum Gan1 gmn1)+Gan3 (gmn3)+Gan5(gmn5) of the low conductance Gan1 (gmn1), the medium conductance Gan3 (gmn3) and the maximum conductance Gan5 (gmn5). Therefore, the time constant with respect to the change in voltage of the signal net_p changes from its preceding value to a further reduced value. That is, the time constant in time t4-t5 is further reduced relative to that in time t3-t4 and therefore, the voltage of the signal net_p corresponding to the sum of the currents i_an1, i_an3 and i_an5 starts changing at a higher rate, as illustrated in FIG. 7. The rate of change in voltage of the signal net_p is still lower than the maximum. Also in time t4-t5, the first TR 602-1-1 (#1), a p-MOSFET, has the gate voltage set to H and maintains the off state and therefore, the i_ap1 is maintained at L (=0).

In time t5-t6, the signal net_a4 is already H; the first TRs 602-1-1 (#1, #3, #5), p-FETs, are in the off state; and the second TRs 602-1-2 (#1, #3, #5), n-FETs, are in the on state. At this time, the state of the equivalent capacitance Cp is close to the completely discharged state, and i_ap3 and i_ap5 are fairly close to zero. The time constant for the signal net_p with respect to the change in voltage at this time corresponds to Gan1 (gmn1)+Gan3(gmn3)+Gan5(gmn5), and the voltage of the signal net_p changes toward L at the maximum rate. The discharge currents i_an1, i_an3, and i_an5 also fall sharply to L (=0).

The output driver device operates in such a way that when the voltage of the signal net_p exceeds the threshold of the first driver transistor circuit 601-1 with respect to power supply voltage VDD, the voltage of the signal net_p changes with the time constant corresponding to Gan1 (gmn1)+Gan3 (gmn3)+Gan5(gmn5), thereby enabling the voltage waveform of the signal net_p to be formed into a sharp waveform such as illustrated in time t4-t5 and t5-t6 in FIG. 7.

In time t4-t6, the first driver transistor circuit 601-1 is turned on and the voltage of the output signal 604 rises sharply from L to H. The signal net_p then changes to L and the current of the signal net_p also changes to L. Then after time t6, the output signal 604 is maintained at H.

Thus, it is possible to form a waveform of net_p rounded so as to be convex upward as a whole in the vicinity of the threshold of the first driver transistor circuit 601-1, and not rounded but made sharp in the region exceeding the threshold.

When the input signal 603 falls from H to L in time t7-t8, i_ap1 rises sharply and falls at a high rate with the reduced time constant, because the conductance of the first TR 602-1-1 (#1), a p-FET, is high. As a result, the current of the signal net_p rises sharply like a pulse and the voltage of the signal net_p also rises sharply with the reduced time constant.

The second pre-driver unit 602-2 can be realized in the configuration described below.

The second pre-driver circuit 601-2 can be realized, for example, by CMOS inverter circuits in a plurality of stages cascaded to sequentially delay the input signal. The input signal 603 is supplied to the first stage inverter circuit (#1). The inverter circuit in each stage is realized by a first control transistor (first TR) 602-2-1, which is, for example, a p-MOSFET, and a second control transistor (second TR) 602-2-2, which is, for example, an n-MOSFET.

Power supply voltage VDD is applied to the source terminals of the first TRs 602-2-1 (#1 to #5), while the source terminals of the second TRs 602-2-2 (#1 to #5) are grounded to ground potential VSS. In each of the stages #1 to #5, the gate terminals of the first TR 602-2-1 and the second TR 602-2-2 are connected together to form an input terminal, and the drain terminals of the first TR 602-2-1 and the second TR 602-2-2 are connected together to form an output terminal, which is connected to the input terminal of the next stage.

The drive currents of the first TRs 602-2-1 (#1 to #5) are i_bp1, i_bp2, i_bp3, i_bp4 and i_bp5, respectively. The drive currents of the second TRs 602-2-2 (#1 to #5) are i_bn1, i_bn2, i_bn3, i_bn4 and i_bn5, respectively. The currents i_bp1 and i_bn1 are controlled by the input signal 603 applied to the input terminal (gate terminals) of the first TR 602-2-1 (#1) and the second TR 602-2-2 (#1) in the first stage to generate an output voltage signal net_b1. The currents i_bp2 and i_bn2 are controlled by the signal net_b1 applied to the input terminal of the first TR 602-2-1 (#2) and the second TR 602-2-2 (#2) in the second stage to generate an output voltage signal net_b2. The currents i_bp3 and i_bn3 are controlled by the signal net_b2 applied to the input terminal of the first TR 602-2-1 (#3) and the second TR 602-2-2 (#3) in the third stage to generate an output voltage signal net_b3. The currents i_bp4 and i_bn4 are controlled by the signal net_b3 applied to the input terminal of the first TR 602-2-1 (#4) and the second TR 602-2-2 (#4) in the fourth stage to generate an output voltage signal net_b4. The currents i_bp5 and i_bn5 are controlled by the signal net_b4 applied to the input terminal of the first TR 602-2-1 (#5) and the second TR 602-2-2 (#5) in the fifth stage to generate an output voltage signal net_b5.

The input signal 603 is supplied to an input terminal of the first TR 602-2-1 (#1) and the second TR 602-2-2 (#1) in the first stage. The inverter circuit including the first TR 602-2-1 (#i) and the second TR 602-2-2 (#i) (i=1, 2, 3, 4, 5) in each stage delay the given signal.

The inverter output voltage signals net_b1, net_b3, and net_b5 in the first, third and fifth stages is the signal net_n. Thus, the relationship between the voltage values of these signals is obtained as follows.

net_n=net_b1=net_b3=net_b5.

Let the input signal 603 change from H to L (or from L to H). As a result of this, each signal net_bi (i=1, 2, 3, 4, 5) changes from H to L or from L to H by being inverted by the inverter circuit in the corresponding stage (the pair of first TR 602-2-1 (#i) and second TR 602-2-2 (#i)) while being delayed by the corresponding propagation delay time. Since each first TR 602-2-1 is a p-MOSFET, the drain current i_bpi flows while increasing (or decreasing) in a linear region of the FET characteristics in response to the change in the gate voltage from H to L (or from L to H). Also, since each second TR 602-2-2 is an n-MOSFET, the drain current i_bni (i=1, 2, 3, 4, 5) flows while decreasing (or increasing) in a linear region of the FET characteristics in response to the change in the gate voltage from H to L (or from L to H). Note that i=1, 2, 3, 4, 5.

The drain current i_bpi is adjusted so as to be larger if the drain-source conductance Gbpi_and the mutual conductance gmpi dependent on the size W/L of the channel of the first TR 602-2-1 are larger. Similarly, the drain current i_bni is adjusted so as to be larger if the drain-source conductance Gbni and the mutual conductance gmni dependent on the size W/L of the channel of the second TR 602-2-2 are larger. Note that i=0, 1, 2, 3, 4, 5.

Thus, the voltage of the signal net_n depends on the drain currents i_bpi_and i_bni (i=1, 3, 5) flowing through the first TRs 602-2-1 and the second TRs 602-2-2 (#1, #3, #5). The signal net_n also depends on Cn*(dvn/dt). Cn is an equivalent capacitance between the signal line of the signal net_n and ground, and vn is a node voltage satisfying vn=net_n. These values are not indicated in FIG. 6. Further, the voltage of the signal net_n also depends on the conductances Gbpi or gmpi (hereinafter referred to as "Gbpi (gmpi)") and Gbni or gmni (hereinafter referred to as "Gbni (gmni)") (i=1, 3, 5) of the first TRs 602-2-1 (#1, #3, #5) and the second TRs 602-2-2 (#1, #3, #5).

A current law as follows is established at any time t.
Cn*(dvn/dt)=i_b1+i_b3+i_b5
i_b1=i_bn1−i_bp1
i_b3=i_bn3−i_bp3
i_b5=i_bn5−i_bp5

The size of the channel of each of the first TRs 602-2-1 and the second TRs 602-2-2 is adjusted so that the following expression is satisfied.

Gbp1(gmp1)<Gbp3(gmp3)<Gbp5(gmp5)

and

Gbn1(gmn1)>Gbn3(gmn3)>Gbn5(gmn5)

and

*Gbn*1(gmp1)>>Gbp3(gmp3)+Gbp5(gmp5)

According to this relationship, the first TRs 602-2-1 in the odd stages are sequentially turned on from the one having a smaller drive force (conductance) to the one having a larger drive force. Also, the second TRs 602-2-2 in the odd stages are sequentially turned off from the one having a larger drive force to the one having a smaller drive force. Simultaneously, the time differences between signal propagations in the stages are adjusted by an inverter circuit including the pairs of the first TRs 602-2-1 and the second TRs 602-2-2 in the stages, thereby adjusting the waveform of the signal net_n. Thus, it is possible to form a waveform rounded in the vicinity of the threshold of the output driver transistor circuit 601-2 so that the waveform is convex downward, while forming a waveform not rounded within a region exceeding the threshold, i.e., a sharp waveform.

The above operation will be described with reference to the waveform diagram of FIG. 7.

The equivalent capacitance Cn as seen toward the second pre-driver unit 602-2 side from the gate terminal of the second driver transistor circuit 601-2 to which the signal net_n is fed changes depending on the operating regions of the first TRs 602-2-1 and the second TRs 602-2-2. However, for ease of description, it is assumed that the equivalent capacitance Cn is substantially constant between the gate of the second driver transistor circuit 601-2 and ground (VSS). Then, if the total conductance G is higher, the time constant (Cn/G) with respect to changes in the total conductance G is smaller and the response of the signal net_n is higher. It is assumed here that the circuit illustrated in FIG. 6 operates in accordance with a small-signal equivalent model in a transient state. Under this assumption, the total conductance G is the sum of the conductances Gbpi (gmpi) and Gbni (gmni) (i=1, 3, 5) of the first TRs 602-2-1 (#1, #3, #5) and the second TRs 602-2-2 (#1, #3, #5). For ease of description, the operation will be described only with respect to Gbpi (gmpi).

When the input signal 603 rises from L to H in time t1-t2, i_bn1 rises sharply and falls at a high rate with a small time constant, because the conductance of the second TR 602-2-2 (#1), an n-FET, is high. As a result, the current of the signal net_n falls sharply like a pulse and the voltage of the signal net_n also falls sharply with the small time constant.

In time t7-t8, the voltage of the input signal 603 changes from H to L. In this time section, while the voltage of net_b1 starts changing from L to H while being inverted, the voltages of net_b2 to net_b5 are still not changed. FIG. 7 illustrates current waveforms. In time t7-t8, i_bn1=0 and the value of i_bp1 starts increasing. Since the second TRs 602-2-2 (#3, #5) are n-MOSFETs and the gate voltages thereon are still H, the state of each of the second TRs 602-2-2 (#3, #5) is close to the on state. Therefore, i_bn3 and i_bn5 start increasing. In time t7-t8, the L level of the voltage held on the equivalent capacitance Cn is the voltage of the signal net_n. Also in time t7-t8, i_bn1 is L because the gate voltage on the second TR 602-2-2 (#1) is L. Before time t7-t8, the second TRs 602-2-2 (#1, #3, #5), which are n-MOSFETs, are in the on state because the gate voltages on the second TRs 602-2-2 (#1, #3, #5) are H, while each of i_bn1, i_bn3 and i_bn5 is maintained at L because the signal net_n is L. Then, in time t7-t8, the second TR 602-2-2 (#1), which is an n-MOSFET, is turned off due to the change from H to L in the input signal 603, and i_bn1 is maintained at L (=0). On the other hand, the second TRs 602-2-2 (#3, #5) are maintained in the on state even in time t7-t8. In response to a start of rising of the voltage of the signal net_n in time t7-t8, the current i_bn3 and i_bn5 start increasing.

In time t8-t9, t9-t10, t10-t11, the voltage of the input signal 603 is already L and i_bp1, i_bp3, and i_bp5 start increasing in this order in the time t8-t9, t9-t10, t10-t11, respectively. In response to these changes, the first TRs 602-2-1 (#1, #3, #5) operate according to the respective conductances Gbpi (gmpi) (i=1, 3, 5), as described below. First, the currents i_bpi (i=1, 3, 5) flow to charge the equivalent capacitance Cn. Since in these time section the second TRs 602-2-2 (#3, #5) are still on, the currents i_bn3 and i_bn5 flow to discharge the equivalent capacitance Cn. Eventually, however, according to the relationship with the currents i_bpi (i=1, 3, 5), a current flows in the direction of charging the equivalent capacitance Cn, and the voltage of the signal net_n increases.

In time t8-t9, the change in voltage of the input signal 603 from H to L in time t7-t8 propagates while being delayed and inverted through the inverter circuit including the first TR 602-2-1 (#1) and the second TR 602-2-2 (#1), and the voltage of net_b1 changes from L to H. In response to this change, in the signal net_n, the currents i_bn3 and i_bn5 flowing through the second TRs 602-2-2 (#3, #5) in the on state are added to the current i_bp1. As a result, a current flows as the signal net_n in the direction of charging the equivalent capacitance Cn. The rate of the current i_bp1 corresponds to the low conductance, i.e., the conductance Gbp1 (gmp1). The time constant with respect to the change in voltage of the signal net_n corresponds to the low conductance Gbp1 (gmn1). As a result, in time t8-t9, the gradient of the change in current i_bp1 is low and the gradient of the change in the voltage waveform of the signal net_n is also low, as illustrated in FIG. 7. In time t8-t9, the gate voltages on the second TRs 602-2-2 (#3, #5), n-MOSFETs, are H. Therefore, i_bn3 and i_bn5 are in a state of increasing in response to the increase in voltage of the signal net_n. Also in time t8-t9, the second TR 602-2-2 (#1), an n-MOSFET, has the gate voltage set to L and maintains the off state and therefore, the value of i_bn1 is maintained at L (=0).

In time t9-t10, the voltage of the input signal 603 is already L and the voltage of net_b1, not indicated in FIG. 7, is already H after being inverted. The change in voltage of net_b1 in time t8-t9 from L to H propagates while being delayed and inverted through the inverter circuit including the first TR 602-2-1 (#2) and the second TR 602-2-2 (#2), and the voltage of net_b2 changes from H to L. In response to this change in net_b2, the currents i_bp1 and i_bp3 are added to the currents i_bn3 and i_bn5 flowing through the second TRs 602-2-2 (#3, #5) still in the on state. Since the currents i_bn1, i_bn3 and i_bn5 may flow simultaneously with each other for a certain time period, there is a possibility of failure to invert net_n depending on the difference between i_bn1 and i_bn3+i_bn5. It is, therefore, necessary to make adjustment for enabling turn-on of the n-channel transistor through which i_bn2 is caused to flow, by paying attention to the balance between these currents.

As a result of this, a current flows in the direction of charging the equivalent capacitance Cn. The rate of the current i_bp1 corresponds to the low conductance, i.e., the conductance Gbp1 (gmp1) of the first TR 602-2-1 (#1). The rate of the current i_bp3 corresponds to the medium conductance, i.e., the conductance Gbp3 (gmp3) of the first TR 602-2-1 (#3). The time constant with respect to the change in voltage of the signal net_n at this time corresponds to the sum Gbp1 (gmp1)+Gbp3(gmp3) of the low conductance Gbp1 (gmp1) and the medium conductance Gbp3 (gmp3). Therefore, the time constant with respect to the change in voltage of the signal net_n changes from its preceding value to a lower value. That is, the time constant in time t9-t10 is reduced relative to that in time t8-t9 and, therefore, the voltage of the signal net_n corresponding to the sum of the currents i_bp1 and i_bp3 changes at a medium rate, as illustrated in FIG. 7.

Also in time t9-t10, the gate voltages on the second TRs 602-2-2 (#3, #5), n-MOSFETs, are H. Therefore, i_bn3 and i_bn5 continue increasing in response to the increase in voltage of the signal net_n. Also in time t9-t10, the second TR 602-2-2 (#1), an n-MOSFET, has the gate voltage set to L (=0) and maintains the off state and therefore, i_bn1 is maintained at L.

In time t10-t11, the voltage of the input signal 603 is L, the voltage of net_b1 is H, and the voltage of net_b2 is L. The change in voltage of net_n2 from H to L in time t9-t10 propagates while being delayed and inverted through the inverter circuit including the first TR 602-2-1 (#3) and the second TR 602-2-2 (#3), and the voltage of net_b3 changes from L to H. Further, after the lapse of the delay time, net_b4 also starts changing from H to L. In response to this, the currents i_bp1, i_bp3, and i_bp5 flow to charge the equivalent capacitance Cn. At this time, i_bn3 changes toward H due to the signal net_b2 changing from H to L. However, the gate voltage on the second TR 602-2-2 (#5) is in a state immediately after starting falling and therefore, i_bn5 still continues increasing. The rate of the current i_bp1 corresponds to the low conductance, i.e., the conductance Gbp1 (gmp1) of the first TR 602-2-1 (#1). The rate of the current i_bp3 corresponds to the medium conductance, i.e., the conductance Gbp3 (gmp3) of the first TR 602-2-1 (#3). The rate of the current i_bp5 corresponds to the maximum conductance, i.e., the conductance Gbp5 (gmp5) of the first TR 602-2-1 (#5). The time constant with respect to the change in voltage of the signal net_n at this time corresponds to the sum: Gbp1 (gmp1)+Gbp3(gmp3)+Gbp5(gmp5) of the low conductance Gbp1 (gmp1), the medium conductance Gbp3 (gmp3) and the maximum conductance Gbp5 (gmp5). Therefore, the time constant with respect to the change in voltage of the signal net_n changes from its preceding value to a further reduced value. That is, the time constant in time t10-t11 is further reduced relative to that in time t9-t10 and therefore, the voltage of the signal net_n corresponding to the sum of the currents i_bp1, i_bp3 and i_bp5 starts changing at higher rate, as illustrated in FIG. 7. The rate of change in voltage of the signal net_n is still lower than its maximum. Also in time t10-t11, the second TR 602-2-2 (#1), an n-MOSFET, has the gate voltage set to L and maintains the off state and therefore, the value of i_bn1 is maintained at L.

In time t11-t12, the signal net_b4 is already L; the second TRs 602-2-2 (#1, #3, #5), n-FETs, are in the off state; and the first TRs 602-2-1 (#1, #3, #5), p-FETs, are in the on state. At this time, the state of the equivalent capacitance Cn is close to the fully charged state, and the values of i_bn3 and i_bn5 are fairly close to zero. The time constant for the signal net_n with respect to the change in voltage at this time corresponds to Gbp1(gmp1)+Gbp3(gmp3)+Gbp5(gmp5), and the voltage of the signal net_n changes toward H at the maximum rate. The charge currents i_bp1, i_bp3, and i_bp5 also fall sharply to L.

The output driver device operates in such a way that when the voltage of the signal net_n exceeds the threshold of the second driver transistor circuit 601-2 with respect to ground potential VSS, the voltage of the signal net_n changes with the time constant corresponding to Gbp1 (gmp1)+Gbp3 (gmp3)+Gbp5 (gmp5), thus enabling the voltage waveform of the signal net_n to be formed as a sharp waveform such as illustrated in time t10-t12 in FIG. 7.

In time t10-t12, the second driver transistor circuit 601-2 is turned on and the voltage of the output signal 604 falls sharply from H to L. The signal net_n then changes to H and the current of the signal net_n changes to L. Then after t12, the output signal 604 is maintained at L.

Note that currents i_ap2, i_an2, i_bp2, i_bn2, i_ap4, i_an4, i_bp4 and i_bn4 not driving the output driver may be used for timing adjustment.

Thus, it is possible to form a waveform of net_n rounded so as to be concave downward as a whole in the vicinity of the threshold of the second driver transistor circuit 601-2, but not rounded in the region exceeding the threshold, i.e., a sharp waveform.

Thus, as illustrated in FIGS. 6 and 7, turn-off of the driver transistor circuit 601-2 is performed by means of a sharp fall of net_n in advance of turn-on of the driver transistor circuit 601-1 caused by a fall of net_p.

Also, turn-off of the driver transistor circuit 601-1 is performed by means of a sharp rise of net_p in advance of turn-on of the driver transistor circuit 601-2 caused by a rise of net_n.

The second embodiment also has similar effects as those of the first embodiment described above with reference to FIG. 5. That is, the through current and noise are reduced and the speed of switching of the output signal is increased.

In the second embodiment, as well as in the first embodiment, only one pair of driver transistor circuits suffices, for example, as the driver transistor circuit 1203, as schematically illustrated in FIG. 12B. Therefore, the mount area for the driver transistor circuit in the second embodiment is smaller than that for the driver transistor circuit 1201 corresponding to the second related art and illustrated in FIG. 12A. Also, the mount area for the pre-driver units 1204-1 and 1204-2 is small. The driver transistor circuit 1203 in FIG. 12B corresponds to the driver transistor circuit 601 in FIG. 6. The pre-driver units 1204-1 and 1204-2 in FIG. 12B correspond to the first pre-driver unit 602-1 and the second pre-driver unit 602-2 in FIG. 6.

In addition, in the second embodiment, the circuit configuration of the portion corresponding to the first pre-driver unit 602-1 and the second pre-driver unit 602-2 illustrated in FIG. 6 is simpler and the circuit layout in the LSI is easier to perform in comparison with the circuit configuration of the first pre-driver unit 302-1 and the second pre-driver unit 302-2 illustrated in FIG. 3.

FIG. 8 illustrates a configuration of an output driver device according to a third embodiment.

The output driver device illustrated in FIG. 8 is disposed in an output section in an LSI, and generates an output signal 804 for controlling turn-on/turn-off of a switching element externally connected, based on on/off of an input signal 803 generated in the LSI.

In FIG. 8, a driver transistor circuit 801 includes a p-MOSFET 801-1, which is a first driver transistor circuit, and an n-MOSFET 801-2, which is a second driver transistor circuit. The configuration and the operation of the driver transistor circuit 801 are substantially the same as those of the driver transistor circuit 301 illustrated in FIG. 3, which can be realized by the p-MOSFET 301-1 and the n-MOSFET 301-2.

The p-MOSFET 801-1 is controlled by a signal net_p generated by a first pre-driver unit 802-1. The n-MOSFET 801-2 is controlled by a signal net_n generated by a second pre-driver unit 802-2.

The first pre-driver unit 802-1 includes a first waveform adjustment inverter circuit and a first feedback inverter circuit.

The first waveform adjustment inverter circuit includes a p-MOSFET 802-1-1 and an n-MOSFET 802-1-2. Power supply voltage VDD is applied to the source terminal of the p-MOSFET 802-1-1. The source terminal of the n-MOSFET 802-1-2 is connected to one terminal of a current source, the other terminal of the current source is connected to ground potential VSS. The gate terminals of the p-MOSFET 802-1-1 and the n-MOSFET 802-1-2 are connected together to form an input terminal, to which the input signal 803 is supplied. The drain terminals of the p-MOSFET 802-1-1 and the n-MOSFET 802-1-2 are connected together to form an output terminal, which is connected to a signal line of the signal net_p.

This first waveform adjustment inverter circuit (802-1-1, 802-1-2) outputs, in response to a rise of the input signal 803, an output signal which is signal amount/signal change timing controlled.

The first waveform adjustment inverter circuit (802-1-1, 802-1-2) also generates, in response to a fall of the input signal 803, the signal net_p in sharp form for causing turn-off of the p-MOSFET 801-1 sufficiently earlier than turn-on of the n-MOSFET 801-2 caused by the signal net_n.

The first feedback inverter circuit (802-1-3, 802-1-4) includes a p-MOSFET 802-1-3 and an n-MOSFET 802-1-4. Power supply voltage VDD is applied to the source terminal of the p-MOSFET 802-1-3. The source terminal of the n-MOSFET 802-1-4 is connected to one terminal of the current source, the other end of the current source is connected to ground potential VSS. The gate terminals of the p-MOSFET 802-1-3 and the n-MOSFET 802-1-4 are connected together to form an input terminal, to which the signal line of the signal net_p is connected. The drain terminals of the p-MOSFET 802-1-3 and the n-MOSFET 802-1-4 are connected to each other.

This first feedback inverter circuit (802-1-3, 802-1-4) receives the signal net_p and adjusts the amount and signal change timing of the signal net_p.

The second pre-driver unit 802-2 includes a second waveform adjustment inverter circuit (802-2-1, 802-2-2) and a second feedback inverter circuit (802-2-3, 802-2-4).

The second waveform adjustment inverter circuit includes a p-MOSFET 802-2-1 and an n-MOSFET 802-2-2. The source terminal of the p-MOSFET 802-2-1 is connected to one terminal of a current source, the other end of the current source is connected to power supply voltage VDD. The source terminal of the n-MOSFET 802-2-2 is connected to ground potential VSS. The gate terminals of the p-MOSFET 802-2-1 and the n-MOSFET 802-2-2 are connected together to form an input terminal, to which the input signal 803 is supplied. The drain terminals of the p-MOSFET 802-2-1 and the n-MOSFET 802-2-2 are connected together to form an output terminal, which is connected to a signal line of the signal net_n.

The second waveform adjustment inverter circuit (802-2-1, 802-2-2) generates, in response to arise of the input signal 803, the signal net_n in sharp form for causing turn-off of the n-MOSFET 801-2 sufficiently earlier than turn-on of the p-MOSFET 801-1 caused by the signal net_p.

The second waveform adjustment inverter circuit (802-2-1, 802-2-2) also outputs, as the signal net_n, in response to a fall of the input signal 803, an output signal which is a signal amount/signal change timing controlled.

The second feedback inverter circuit (802-2-3, 802-2-4) includes a p-MOSFET 802-2-3 and an n-MOSFET 802-2-4. The source terminal of the p-MOSFET 802-2-3 is connected to one terminal of the current source, the other end of the current source is connected to power supply voltage VDD. The source terminal of the n-MOSFET 802-2-4 is connected to ground potential VSS. The gate terminals of the p-MOSFET 802-2-3 and the n-MOSFET 802-2-4 are connected together to form an input terminal, to which the signal line of the signal net_n is connected. The drain terminals of the p-MOSFET 802-2-3 and the n-MOSFET 802-2-4 are connected to each other.

This second waveform adjustment inverter circuit receives the signal net_n and adjusts the signal amount and signal change timing of the signal net_n.

The operation of the third embodiment will be described with reference to the operating waveform diagram of FIG. 9. In the following description, for example, a time section from t1 to t2 is referred to time t1-t2, a time section from t2 to t3 is referred to time t2-t3 and so on.

The operation of the first pre-driver unit 802-1 will first be described.

Cp is an equivalent capacitance representing all capacitances existing between the signal net_p and ground potential in the circuit. Cp is not indicated in the figure.

Before t1, when the input signal 803 is L, the p-MOSFET 802-1-1 is in the on state, but substantially no current flows because the equivalent capacitance Cp is in a substantially fully charged state. Before t1, therefore, i_a0 is L (=0).

In time t1-t2, when the input signal 803 rises from L to H, the p-MOSFET 802-1-1 is turned off and i_a0 is therefore maintained at L. Also, the n-MOSFET 802-1-2 is changed toward the on state. Discharging of the equivalent capacitance Cp is thereby started and a current i_a1 starts flowing from the equivalent capacitance Cp. As a result, the voltage of the signal net_p starts falling.

With the fall in voltage of the signal net_p, the p-MOSFET 802-1-3 receiving the signal net_p at the gate starts turning on in time t2-t3 and i_a2 rises with a delay from the rise of i_a1. At this time, since the current source I0 exists, i_a1+i_a2=I0. If the first feedback circuit including the p-MOSFET 802-1-3 and the n-MOSFET 802-1-4 does not exist, the current waveform of i_a1 is as indicated by the broken line in FIG. 9. By being affected by i_a2 generated by the first feedback circuit, the current waveform of i_a1 is rounded so as to be concave downward. Thus, not only i_a1 but also i_a2 flows in the transient state, thereby enabling to limiting of the increase in current i_a1 using the effect of the current source 10. The equivalent capacitance Cp discharge current is not fed to a common gate input to the p-MOSFET 802-1-3 and the n-MOSFET 802-1-4; the equivalent capacitance Cp discharge current depends only on i_a1. Therefore, the voltage of the equivalent capacitance Cp, i.e., the falling voltage of the signal net_p, has a waveform convex upward, i.e., a waveform of a reduced falling speed, according to the current i_a1, the rising current rate of which is limited. The waveform of the signal net_p is thus rounded.

In time t3-t4, the voltage of the signal net_p further falls and the state of the n-MOSFET 802-1-4 changes toward the off state. Therefore i_a2 falls toward L. Conversely, at this time, the current i_a1 increases in accordance with the relationship: i_a1+i_a2=I0.

The current i_a1 is maximized when it becomes the initial current of discharge of the equivalent capacitance Cp. Thereafter, i_a1 falls with a time constant determined by the conductance of the n-MOSFET 802-1-2 that discharges the equivalent capacitance Cp. Therefore, this conductance is set to a high value to enable control performed by reducing the time constant of the n-MOSFET 802-1-2 and rapidly discharging the equivalent capacitance Cp by the current value i_a1 in time t4-t5 and t5-t6 to cause the voltage of the signal net_p to sharply fall correspondingly.

Thus, it is possible to form a voltage waveform of the signal net_p which is rounded in the vicinity of the threshold Vth of the first driver transistor circuit 801-1 so as to be convex, and which thereafter changes sharply.

On the other hand, the conductance Ga0 (gm0) of the p-MOSFET 802-1-1 is set higher than the conductance Ga1 (gm1) of the n-MOSFET 802-1-2. Thus, when the input signal 803 falls from H to L in time t7-t8, the charge current i_a0 flows in a surging manner to the equivalent capacitance Cp.
Ga0(gm0)>Ga1(gm1)

As a result, the voltage waveform of the signal net_p rises sharply with a small time constant. In this way, turn-off of the first driver transistor circuit 801-1 can be effected earlier and the through current through the driver transistor circuit 801 can be reduced.

The operation of the second pre-driver unit 802-2 will be described.

Cn is an equivalent capacitance representing all capacitances existing between the signal net_n and ground potential in the circuit are replaced. Cn is not indicated in the figure.

When the input signal 803 rises from L to H in time t1-t2, a discharge current i_b0 flows in a surging manner from the equivalent capacitance Cn because the conductance Gb0 (gm0) of the n-MOSFET 802-2-2 is set higher than the conductance Gb1 (gm1) of the p-MOSFET 802-2-1.
Gb0(gm0)>Gb1(gm1)

As a result, the voltage waveform of the signal net_n falls sharply with a small time constant. In this way, turn-off of the second driver transistor circuit 801-2 can be effected earlier and the through current through the driver transistor circuit 801 can be reduced.

In time t2-t7, when the input signal 803 is H, the n-MOSFET 802-2-2 is in the on state but no current flows because the equivalent capacitance Cn is substantially in the completely discharged state. During that time period, therefore, i_b0 is L.

In time t7-t8, when the input signal 803 falls from H to L, the n-MOSFET 802-2-2 is turned off and the i_b0 is therefore maintained at L. Also, the p-MOSFET 802-2-1 is changed toward the on state. Charging of the equivalent capacitance Cn is thereby started and a current i_b1 starts flowing to the equivalent capacitance Cn. As a result, the voltage of the signal net_n starts rising.

With the increase in voltage of the signal net_n, the n-MOSFET 802-2-4 receiving the signal net_n at the gate starts turning on in time t8-t9 and i_b2 rises with a delay from the rise of i_b1. At this time, since the current source I0' exists, i_b1+i_b2=I0'. If the feedback circuit including the p-MOSFET 802-2-3 and the n-MOSFET 802-2-4 does not exist, the current waveform of i_b1 is as indicated by the broken line in FIG. 9. By being affected by i_b2 generated by this feedback circuit, the current waveform of i_b1 is rounded so as to be concave downward. Thus, not only i_b1 but also i_b2 flows in the transient state, thereby enabling limiting of the fall in current i_b1 using the effect of the current source I0'. The equivalent capacitance Cn charge current is not fed to a common gate input to the p-MOSFET 802-2-3 and the n-MOSFET 802-2-4; the equivalent capacitance Cn charge current depends only on i_b1. Therefore, the voltage of the equivalent capacitance Cn, i.e., the rising voltage of the signal net_n, has a waveform concave downward, i.e., a waveform of a reduced rising speed, according to the current i_b1, the rising current rate of which is limited. The waveform of the signal net_n is thus rounded.

In time t9-t10, the voltage of the signal net_n further rises and the state of the p-MOSFET 802-2-3 changes toward the off state. Therefore i_b2 falls toward L. Conversely, at this time, the current value of i_b1 increases in accordance with the relationship: i_b1+i_b2=I0'.

The current i_b1 is maximized when it becomes the initial current of charge on the equivalent capacitance Cn. Thereafter, i_b1 falls with the time constant determined by the conductance of the p-MOSFET 802-2-1 that charges the equivalent capacitance Cn. Therefore, this conductance is set to a high value to enable control performed by reducing the time constant of the p-MOSFET 802-2-1 and rapidly charging the equivalent capacitance Cn by the current i_b1 in time t10-t11 and t11-t12 to cause the voltage of the signal net_n to sharply rise correspondingly.

Thus, it is possible to form a waveform of the signal net_n which is rounded in the vicinity of the threshold Vth of the second driver transistor circuit 801-2 so as to be concave downward, and which thereafter changes sharply.

Figure 9:
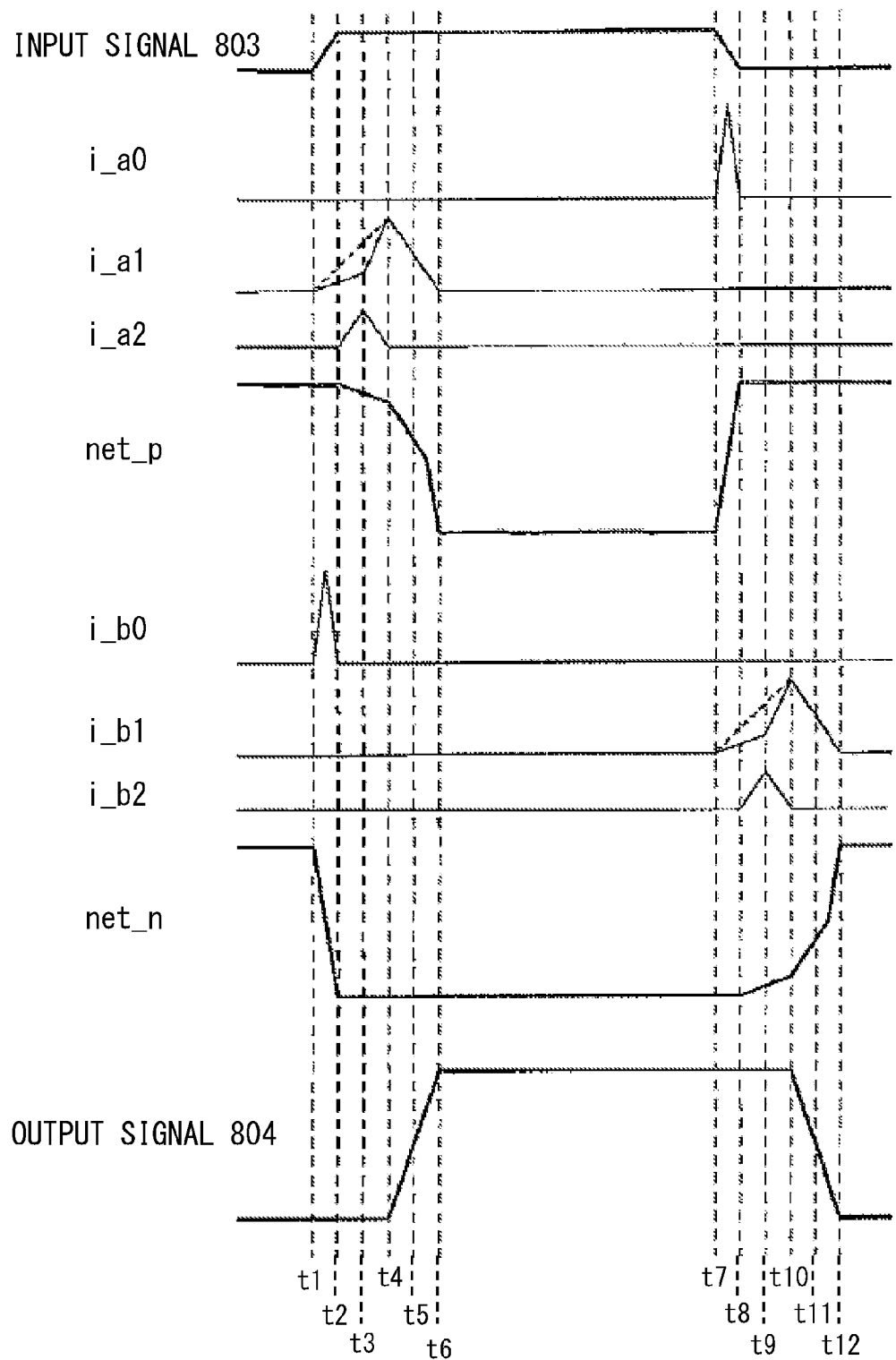
FIG. 9 is a waveform diagram relating to the output driver device according to the third embodiment.

Thus, as illustrated in FIGS. 8 and 9, turn-off of the driver transistor circuit 801-2 caused by a sharp fall of net_n is performed in advance of turn-on of the driver transistor circuit 801-1 caused by a fall of net_p.

Also, turn-off of the driver transistor circuit 801-1 caused by a sharp rise of net_p is performed in advance of turn-on of the driver transistor circuit 801-2 caused by a rise of net_n.

The third embodiment also has similar effects as those of the first embodiment described above with reference to FIG. 5. That is, the through current and noise are reduced and the speed of switching of the output signal is increased.

In the third embodiment, as well as in the first or second embodiment, only one pair of driver transistor circuits is provided, for example, as the driver transistor circuit 1203, as schematically illustrated in FIG. 12B. Therefore, the mount area for the driver transistor circuit in the third embodiment is smaller than that for the driver transistor circuit 1201 corresponding to the second related art and illustrated in FIG. 12A. Also, the mount area for the pre-driver units 1204-1 and 1204-2 is small in the third embodiment. The driver transistor circuit 1203 in FIG. 12B corresponds to the driver transistor circuit 801 in FIG. 8. The pre-driver units 1204-1 and 1204-2 in FIG. 12B correspond to the first pre-driver unit 802-1 and the second pre-driver unit 802-2 in FIG. 8. Note that the number of basic circuits included in the first pre-driver unit 802-1 and the second pre-driver unit 802-2 is different from those in the first and second embodiments.

In addition, in the third embodiment, the number of MOSFETs necessary components of the first pre-driver unit 802-1 and the second pre-driver unit 802-2 illustrated in FIG. 8 is smaller in comparison with the sections 302-1 and 302-2 illustrated in FIG. 3 or the sections 602-1 and 602-2 illustrated in FIG. 6.

FIG. 10 illustrates a configuration of an output driver device according to a fourth embodiment.

The output driver device illustrated in FIG. 10 is disposed in an output section in an LSI, and generates an output signal 1004 for controlling turn-on/turn-off of a switching element externally connected, based on on/off of an input signal 1003 generated in the LSI.

In FIG. 10, a driver transistor circuit 1001 includes a p-MOSFET 1001-1, which is a first driver transistor circuit, and an n-MOSFET 1001-2, which is a second driver transistor circuit. The configuration and the operation of the driver transistor circuit 1001 are substantially the same as those of the driver transistor circuit 301 illustrated in FIG. 3, which includes the p-MOSFET 301-1 and the n-MOSFET 301-2.

The p-MOSFET 1001-1 is controlled by a signal net_p generated in a first pre-driver unit 1002-1. The n-MOSFET 1001-2 is controlled by a signal net_n generated in a second pre-driver unit 1002-2.

The first pre-driver unit 1002-1 can be realized in the configuration described below.

A first waveform adjustment inverter circuit includes a p-MOSFET 1002-1-1 and an n-MOSFET 1002-1-2. Power supply voltage VDD is applied to the source terminal of the p-MOSFET 1002-1-1. The gate terminals of the p-MOSFET 1002-1-1 and the n-MOSFET 1002-1-2 are connected together to form an input terminal, to which an input signal 1003 is supplied. The drain terminals of the p-MOSFET 1002-1-1 and the n-MOSFET 1002-1-2 are connected to each other to form an output terminal connected to a signal line of the signal net_p.

The first waveform adjustment inverter circuit outputs, as the signal net_p, in response to a rise of the input signal 1003, an output signal which is signal amount/signal change timing controlled. The first waveform adjustment inverter circuit also outputs, in response to a fall of the input signal 1003, the signal net_p in sharp form for effecting turn-off of the p-MOSFET 1001-1 sufficiently earlier than turn-on of the n-MOSFET 1001-2 caused by the signal net_n.

A first feedback p-MOSFET 1002-1-4 receives the signal net_p at the gate terminal. The first feedback p-MOSFET 1002-1-4 then outputs, through the drain terminal, a waveform control current i_a1, which is signal amount/signal change timing controlled.

A p-MOSFET 1002-1-3, which is a bias signal output transistor circuit, is supplied with a bias voltage Vbias_a through the gate terminal and outputs a bias signal current i_a0 through the drain terminal.

Power supply voltage VDD is applied to the source terminals of the p-MOSFETs 1002-1-3 and 1002-1-4.

An n-MOSFET 1002-1-5 flows current I_a=i_a0+i_a1=i_a2 obtained by a current mirror. The drain terminal is connected to the source terminal of the n-MOSFET 1002-1-2, and the source terminal is connected to ground potential VSS.

This waveform adjustment transistor circuit adjusts the signal amount and signal change timing of the signal net_p output from the first waveform adjustment inverter circuits 1002-1-1 and 1002-1-2 in response to a rise of the input signal 1003.

An n-MOSFET 1002-1-6 flows current I_a=i_a0+i_a1 and has the source terminal connected to ground potential VSS. The n-MOSFET 1002-1-6 and the n-MOSFET 1002-1-5 form a first current mirror circuit. By this configuration, i_a2=i_a0+i_a1 can be established.

The second pre-driver unit 1002-2 can be realized in the configuration described below.

A second waveform adjustment inverter circuit includes an n-MOSFET 1002-2-1 and a p-MOSFET 1002-2-2. The gate terminals of the n-MOSFET 1002-2-1 and the p-MOSFET 1002-2-2 are connected together to form an input terminal, to which the input signal 1003 is supplied. The drain terminals of the n-MOSFET 1002-2-1 and the p-MOSFET 1002-2-2 are connected to each other to form an output terminal connected to a signal line of the signal net_n.

The second waveform adjustment inverter circuit outputs, in response to a rise of the input signal 1003, the signal net_n in sharp form for effecting turn-off of the n-MOSFET 1001-2 sufficiently earlier than turn-on of the p-MOSFET 1001-1 caused by the signal net_p. The second waveform adjustment inverter circuit also outputs, as the signal net_n, an output signal which is signal amount/signal change timing controlled.

A second feedback n-MOSFET 1002-2-4 is supplied with the signal net_n at the gate terminal. The second feedback n-MOSFET 1002-2-4 flows, in response to a fall of the input signal 1003, a waveform control current i_b1, which is signal amount/signal change timing controlled.

An n-MOSFET 1002-2-3, which is a bias signal output transistor circuit, is supplied with a bias voltage Vbias_b at the gate terminal and flows a bias signal current i_b0.

The source terminals of the n-MOSFETs 1002-2-3 and 1002-2-4 are connected to ground potential VSS.

A p-MOSFET 1002-2-5 flows current I_b=i_b0+i_b1=i_b2 obtained by a current mirror. The drain terminal is connected to the source terminal of the p-MOSFET 1002-2-2.

Power supply voltage VDD is applied to the source terminal of the p-MOSFET 1002-2-5.

This waveform adjustment transistor circuit adjusts the signal amount and signal change timing of the signal net_n output from the second waveform adjustment inverter circuits 1002-2-1 and 1002-2-2 in response to a fall in the driver transistor circuit 1001-2 caused by the input signal 1003.

A p-MOSFET 1002-2-6 flows current I_b=i_b0+i_b1. Power supply voltage VDD is applied to the source terminal of the p-MOSFET 1002-2-6. The p-MOSFET 1002-2-6 and the p-MOSFET 1002-2-5 form a second current mirror circuit. By this configuration, i_b2=i_b0+i_b1 can be established.

The operation of the fourth embodiment will be described with reference to the operating waveform diagram of FIG. 11.

In the following description, for example, a time section from t1 to t2 is referred to time t1-t2, a time section from t2 to t3 is referred to time t2-t3 and so on.

The operation of the first pre-driver unit 1002-1 will first be described.

Cp is an equivalent capacitance representing all capacitances existing between the signal net_p and ground potential in the circuit. Cp is not indicated in the figure.

Before t1, when the input signal 1003 is L, the p-MOSFET 1002-1-1 is in the on state but substantially no current flows because the equivalent capacitance Cp is in a substantially fully charged state. Before t1, therefore, i_a3=i_a2 is L and no current flows. Since the input signal 1003 is L (=0), the n-MOSFET 1002-1-2 in the first waveform adjustment circuit is in the off state and i_a2 is L (=0). Since the n-MOSFETs 1002-1-5 and 1002-1-6 form the first current mirror circuit, the current I_a=i_a0+i_a1 flowing through the n-MOSFET 1002-1-6 is also L (=0). Therefore, each of i_a0 and i_a1 is L (=0).

When the input signal 1003 rises from L to H in time t1-t2, the n-MOSFET 1002-1-2 is turned on to cause i_a2 to start flowing, thereby starting discharge from the equivalent capacitance Cp that determines the voltage of the signal net_p. As a result, I_a also starts flowing. At this time, while the n-MOSFET 1002-1-2 is on, the p-MOSFET 1002-1-4 in the first feedback circuit is still in the off state because of the propagation delay; i_a1 still cannot rise; and I_a=i_a0=i_a1=0. Rising of i_a2 is thereby suppressed. Note that the bias voltage Vbias_a is always L and the p-MOSFET 1002-1-3 is constantly in the on state.

When the input signal 1003 is H in time t2-t3, the current i_a2 increases; the discharge of the equivalent capacitance Cp progresses; and the voltage of the signal net_p therefore starts decreasing. At this time, the p-MOSFET 1002-1-4 is turned on and i_a1 starts flowing. Thus, when i_a2 flows and when the equivalent capacitance Cp discharge current flows, the voltage of the signal net_p falls gradually and the p-MOSFET 1002-1-4 that causes i_a1 to flow is gradually turned on.

Further, in time t3-t4 and t4-t5, the state transition progresses so that I_a=i_a2=i_a0+i_a1, and the current i_a2 increases. Tuning is made with respect to this situation so that the falling change in voltage of the signal net_p is rounded in the vicinity of the threshold Vth of the first driver transistor circuit 1001-1. That is, i_a2 and i_a1 increase so that their waveforms are convex downward and the signal net_p is thereby caused to fall so that the voltage waveform is convex upward, thus the voltage waveform of the signal net_p is rounded.

When i_a1 reaches the upper limit after time t4-t5 is over and time t5-t6 begins, discharge from the equivalent capacitance Cp only by i_a2 starts. The conductance of the n-MOS-FETs 1002-1-2 and 1002-1-5 is set to a high value (the time constant is set to a small value) such that the i_a2 discharge current is increased. As a result, the current i_a2 falls rapidly to L (=0) with a small time constant and the voltage waveform of the signal net_p also falls rapidly to L with the small time constant.

Thus, it is possible to form a voltage waveform of the signal net_p which is rounded in the vicinity of the threshold Vth of the first driver transistor circuit 1001-1, and which thereafter changes sharply.

On the other hand, when the input signal 1003 falls from H to L in time t7-t8, the charge current i_a3 flows in a surging manner to the equivalent capacitance Cp because the conductance of the p-MOSFET 1002-1-1 is set to a high value. That is, i_a3 rises rapidly and falls sharply with the small time constant. As a result, the voltage waveform of the signal net_p rises sharply with the small time constant. In this way, turn-off of the first driver transistor circuit 1001-1 is performed earlier and the through current in the driver transistor circuit 1001 can be reduced.

The operation of the second pre-driver unit 1002-2 will be described.

Cn is an equivalent capacitance representing all capacitances existing between the signal net_n and ground potential in the circuit.

When the input signal 1003 rises from L to H in time t1-t2, a discharge current i_b3 flows in a surging manner from the equivalent capacitance Cn because the conductance of the n-MOSFET 1002-2-1 is set to a high value. As a result, the voltage waveform of the signal net_n falls sharply with a small time constant. In this way, turn-off of the second driver transistor circuit 1001-2 is performed earlier and the through current through the driver transistor circuit 1001 can be reduced.

In time t2-t7, when the input signal 1003 is H, the n-MOSFET 1002-2-1 is in the on state but substantially no current flows because the equivalent capacitance Cn is in a substantially fully discharged state. In that time period, therefore, the value of i_b2=i_b3 is L and no current flows. Since the input signal 1003 is H, the p-MOSFET 1002-2-2 in the second waveform adjustment circuit is in the off state and i_b2 is L. Since the p-MOSFETs 1002-2-5 and 1002-2-6 form the second current mirror circuit, the current I_b=i_b0+i_b1 flowing through the n-MOSFET 1002-2-6 is L. Therefore, each of i_b0 and i_b1 is L.

When the input signal 1003 falls from H to L in time t7-t8, the p-MOSFET 1002-2-2 is turned on to cause i_b2 to start flowing, thereby starting charging on the equivalent capacitance Cn that determines the voltage of the signal net_n. As a result, I_b also starts flowing. At this time, while the p-MOSFET 2-2-2 is on, the n-MOSFET 1002-2-4 in the second feedback circuit is still in the off state because of the propagation delay; i_b1 still does not rise; and I_b=i_b0=i_b1=0. Rising of i_b2 is thereby suppressed. The bias voltage Vbias_b is always H and the n-MOSFET 1002-2-3 is constantly in the on state.

When the input signal 1003 is L in time t8-t9, the current i_b2 increases; the charge on the equivalent capacitance Cn progresses; and the voltage of the signal net_n therefore starts increasing. At this time, the n-MOSFET 1002-2-4 is turned on and i_b1 starts flowing. Thus, when i_b2 flows and when the equivalent capacitance Cn charge current flows, the voltage of the signal net_n rises gradually and the n-MOSFET 1002-2-4 that causes i_b1 to flow is gradually turned on.

Further, in time t9-t10 and t10-t11, the state transition progresses so that I_b=i_b2=i_b0+i_b1, and the current i_b2 increases. Tuning is made with respect to this situation so that the rising change in voltage of the signal net_n is rounded in the vicinity of the threshold Vth of the second driver transistor circuit 1001-2. That is, i_b2 and i_b1 increase so that their waveforms are convex downward and the signal net_n is thereby caused to rise so that the voltage waveform is convex downward, thus the voltage waveform of the signal net_n is rounded.

When i_b1 reaches the upper limit after time t10-t11 is over and time t11-t12 begins, charge on the equivalent capacitance Cn only by i_b2 starts. The conductance of the p-MOSFETs 1002-2-2 and 1002-2-5 is set to a high value (the time constant is set to a small value) such that the charge current i_b2 is to be large. As a result, the current of i_b2 falls rapidly to L and the voltage waveform of the signal net_n also falls rapidly to H with the small time constant.

Thus, it is possible to form a waveform of the signal net_n which is rounded in the vicinity of the threshold Vth of the second driver transistor circuit 1001-2, and which thereafter changes sharply.

Figure 11:
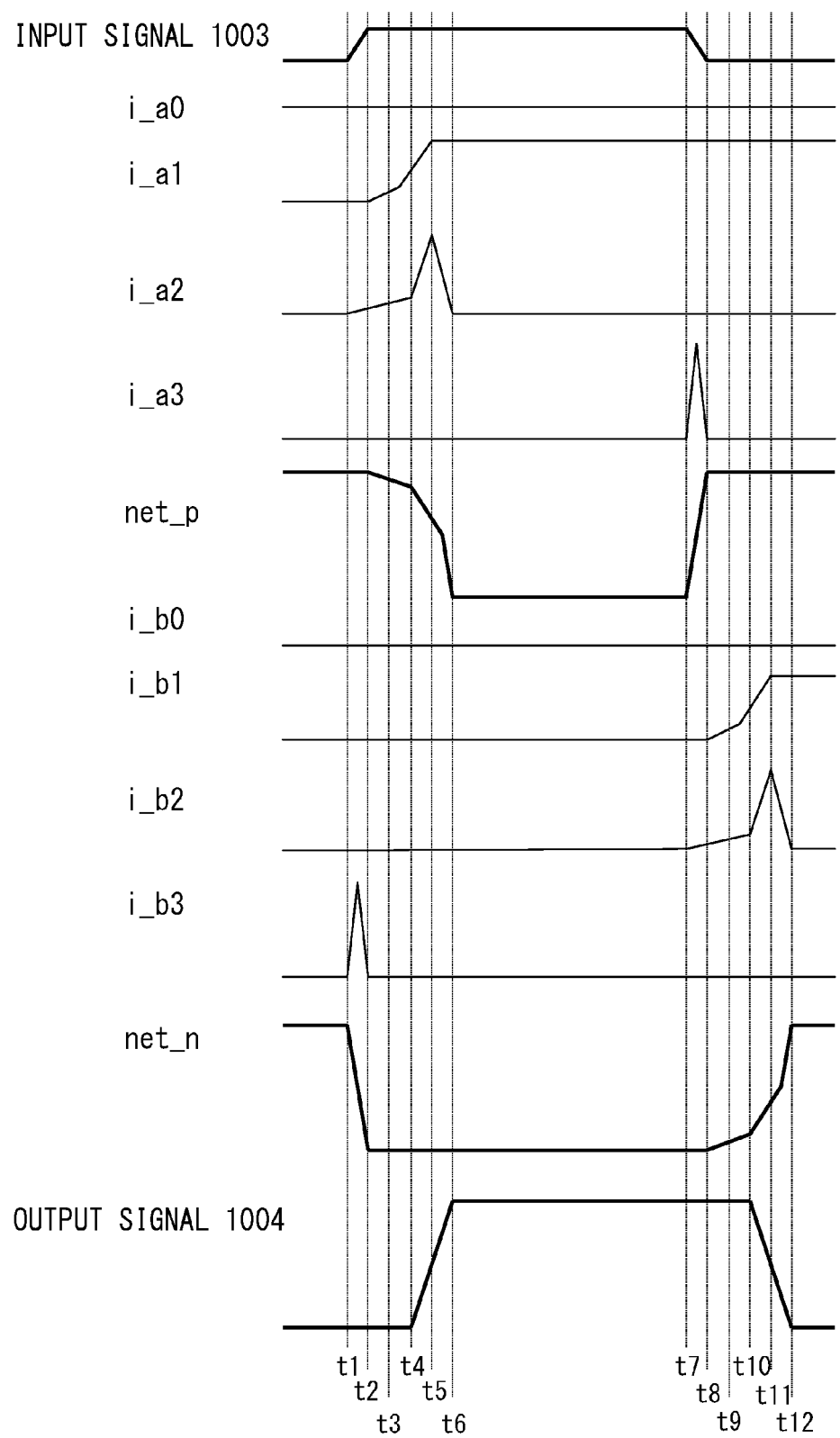
FIG. 11 is a waveform diagram relating to the output driver device according to the fourth embodiment.

Thus, as illustrated in FIGS. 10 and 11, turn-off of the driver transistor circuit 1001-2 caused by a sharp fall of net_n is performed in advance of turn-on of the driver transistor circuit 1001-1 caused by a fall of net_p.

Also, turn-off of the driver transistor circuit 1001-1 caused by a sharp rise of net_p is performed in advance of turn-on of the driver transistor circuit 1001-2 caused by a rise of net_n.

The fourth embodiment also has similar effects as those of the first embodiment described above with reference to FIG. 5.

In the fourth embodiment, as well as in the first, second or third embodiment, only one pair of driver transistor circuits is provided, for example, as the driver transistor circuit 1203, as schematically illustrated in FIG. 12B. Therefore, the mount area for the driver transistor circuit in the fourth embodiment is smaller than that for the driver transistor circuit 1201 corresponding to the second related art and illustrated in FIG. 12A. Also, the mount area for the pre-driver units 1204-1 and 1204-2 is small in the fourth embodiment. The driver transistor circuit 1203 in FIG. 12B corresponds to the driver transistor circuit 1001 in FIG. 10. The pre-driver units 1204-1 and 1204-2 in FIG. 12B correspond to the first pre-driver unit 1002-1 and the second pre-driver unit 1002-2 in FIG. 10. Note that the number of basic circuits included in the first pre-driver unit 1202-1 and the second pre-driver unit 1204-2 is different from those in the first and second embodiments.

In addition, in the fourth embodiment, as well as in the third embodiment, the number of MOSFETs included in the first pre-driver unit 1002-1 and the second pre-driver unit 1002-2 illustrated in FIG. 10 is smaller in comparison with the sections 302-1 and 302-2 illustrated in FIG. 3 or the sections 602-1 and 602-2 illustrated in FIG. 6.

In the first through fourth embodiments, circuit components such as p-MOSFETs, n-MOSFETs, buffer circuits and inverter circuits is used in the first pre-driver unit and the second pre-driver unit. The present invention, however, is not limited to this configuration. The present invention may be implemented by using any other circuit elements if the same or similar configuration and effects as those in the disclosed technique are realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment (s) of the present inventions has (have) been described in detail, it should be understood that the various changes, substitutions, and alterations could be made hereto without departing from the spirit and scope of the invention.

What is claimed is:

1. A driver device which drives a load circuit by a common output signal from a first driver transistor and a second driver transistor, the driver device comprising:
   a first pre-driver unit that outputs a first driver control signal to the first driver transistor in response to input signal; and
   a second pre-driver unit that outputs a second driver control signal to the second driver transistor in response to the input signal; wherein
   the second pre-driver unit changes the second driver control signal so as to turn off the second driver transistor, and the first pre-driver unit controls the first driver control signal in such a manner that the first driver control signal changes slower compared with change speed of the second driver control signal in the vicinity of a threshold of the first driver transistor and changes faster compared with change speed of the first driver control signal in the vicinity of the threshold in the region exceeding the threshold in order to delay the turn-on of the first driver transistor with respect to the turn-off of the second driver transistor, and
   the first pre-driver unit changes the first driver control signal so as to turn off the first driver transistor, and the second pre-driver unit controls the second driver control signal in such a manner that the second driver control signal changes slower compared with change speed of the first driver control signal in the vicinity of a threshold of the second driver transistor and changes faster compared with change speed of the second driver control signal in the vicinity of the threshold in a region exceeding the threshold in order to delay the turn-on of the second driver transistor with respect to the turn-off of the first driver transistor, and wherein
   the first pre-driver unit includes:
      a plurality of cascaded first buffer circuits to sequentially delay the input signal;
      a plurality of first transistors, each of the first transistors being connected to an output terminal of corresponding one of first buffer circuits, that generate the first driver control signal in such a manner that the first driver control signal is rounded in the vicinity of a threshold of the first driver transistor and is sharply changed in a region exceeding the threshold based on output signals from the plurality of first buffer circuits, when the input signal to cause the first driver transistor to be turned on by the first driver control signal is applied; and
      a second transistor to sharply change the first driver control signal when the input signal to cause the first driver transistor to be turned off by the first driver control signal is applied, and wherein
   the second pre-driver unit includes:
      a plurality of cascaded second buffer circuits to sequentially delay the input signal;
      a third transistor to sharply change the second driver control signal when the input signal to cause the second driver transistor to be turned off by the second driver control signal is applied;
      and a plurality of fourth transistors, each of the fourth transistors being connected to an output terminal of corresponding one of second buffer circuits, that generate the second driver control signal in such a manner that the second driver control signal is rounded in the vicinity of a threshold of the second driver transistor and is sharply changed in a region exceeding the threshold based on output signals from the plurality of second buffer circuits, when the input signal to cause the second driver transistor to be turned on by the second driver control signal is applied.

2. A driver device which drives a load circuit by a common output signal from a first driver transistor and a second driver transistor, the driver device comprising:
a first pre-driver unit that outputs a first driver control signal to the first driver transistor in response to input signal; and
a second pre-driver unit that outputs a second driver control signal to the second driver transistor in response to the input signal; wherein
the second pre-driver unit changes the second driver control signal so as to turn off the second driver transistor, and the first pre-driver unit controls the first driver control signal in such a manner that the first driver control signal changes slower compared with change speed of the second driver control signal in the vicinity of a threshold of the first driver transistor and changes faster compared with change speed of the first driver control signal in the vicinity of the threshold in the region exceeding the threshold in order to delay the turn-on of the first driver transistor with respect to the turn-off of the second driver transistor, and
the first pre-driver unit changes the first driver control signal so as to turn off the first driver transistor, and the second pre-driver unit controls the second driver control signal in such a manner that the second driver control signal changes slower compared with change speed of the first driver control signal in the vicinity of a threshold of the second driver transistor and changes faster compared with change speed of the second driver control signal in the vicinity of the threshold in a region exceeding the threshold in order to delay the turn-on of the second driver transistor with respect to the turn-off of the first driver transistor, and wherein
the first pre-driver unit includes:
a plurality of cascaded first buffer circuits to sequentially delay the input signal;
a plurality of first n-MOSFETs, each of which corresponds to one of the first buffer circuits, each of gate terminals being connected to an output terminal of corresponding first buffer circuit, each of drain terminals being connected to a signal line of the first driver control signal, and each of source terminals being applied with second voltage; and
a first p-MOSFET, a source terminal being applied first voltage higher than the second voltage, a drain terminal being connected to the signal line of the first driver control signal, and a gate terminal being applied with the input signal, and
the second pre-driver unit includes:
a plurality of cascaded second buffer circuits to sequentially delay the input signal; a plurality of second p-MOSFETs, each of which corresponds to one of the second buffer circuits, each of gate terminals being connected to an output terminal of corresponding second buffer circuit, each of drain terminals being connected to a signal line of the second driver control signal, each of source terminals being applied with the first voltage; and
a second n-MOSFET, a source terminal being applied the second voltage, a drain terminal being connected to the signal line of the second driver control signal, and a gate terminal being applied with the input signal.

3. The driver device according to claim 2, wherein
the sizes of the plurality of first n-MOSFETs are gradually increased along the direction from an input stage to an output stage,
the size of the first p-MOSFET is larger than the sum of the sizes of the plurality of first n-MOSFETs, the sizes of the plurality of second p-MOSFETs are gradually increased along the direction from an input stage to an output stage, and
the size of the second n-MOSFET is larger than the sum of the sizes of the plurality of second p-MOSFETs.

4. An integrated circuit including a driver device, wherein
the driver device drives a load circuit by a common output signal from a first driver transistor and a second driver transistor,
the driver device comprising:
a first pre-driver unit that outputs a first driver control signal to the first driver transistor in response to input signal; and
a second pre-driver unit that outputs a second driver control signal to the second driver transistor in response to the input signal; wherein
the first pre-driver unit includes:
a plurality of cascaded first buffer circuits to sequentially delay the input signal;
a plurality of first transistors, each of the first transistors being connected to an output terminal of corresponding one of first buffer circuits, that generate the first driver control signal in such a manner that the first driver control signal is rounded in the vicinity of a threshold of the first driver transistor and is sharply changed in a region exceeding the threshold based on output signals from the plurality of first buffer circuits in order to delay the turn-on of the first driver transistor with respect to the turn-off of the second driver transistor, when the input signal to cause the first driver transistor to be turned on by the first driver control signal is applied; and
a second transistor to sharply change the first driver control signal when the input signal to cause the first driver transistor to be turned off by the first driver control signal is applied, and wherein
the second pre-driver unit includes:
a plurality of cascaded second buffer circuits to sequentially delay the input signal;
a third transistor to sharply change the second driver control signal when the input signal to cause the second driver transistor to be turned off by the second driver control signal is applied; and
a plurality of fourth transistors, each of the fourth transistors being connected to an output terminal of corresponding one of second buffer circuits, that generate the second driver control signal in such a manner that the second driver control signal is rounded in the vicinity of a threshold of the second driver transistor and is sharply changed in a region exceeding the threshold based on output signals from the plurality of second buffer circuits in order to delay the turn-on of the second driver transistor with respect to the turn-off of the first driver transistor, when the input signal to cause the second driver transistor to be turned on by the second driver control signal is applied.

5. An integrated circuit including a driver device, wherein the driver device drives a load circuit by a common output signal from a first driver transistor and a second driver transistor, the driver device comprising:

a first pre-driver unit that outputs a first driver control signal to the first driver transistor in response to input signal; and a second pre-driver unit that outputs a second driver control signal to the second driver transistor in response to the input signal; wherein the second pre-driver unit sharply changes the second driver control signal so as to turn off the second driver transistor, and the first pre-driver unit controls the first driver control signal in such a manner that the first driver control signal is rounded in the vicinity of a threshold of the first driver transistor and is sharply changed in a region exceeding the threshold in order to delay the turn-on of the first driver transistor with respect to the turn-off of the second driver transistor, and the first pre-driver unit sharply changes the first driver control signal so as to turn off the first driver transistor, and the second pre-driver unit controls the second driver control signal in such a manner that the second driver control signal is rounded in the vicinity of a threshold of the second driver transistor and is sharply changed in a region exceeding the threshold in order to delay the turn-on of the second driver transistor with respect to the turn-off of the first driver transistor, wherein the first pre-driver unit includes:

a plurality of cascaded first buffer circuits to sequentially delay the input signal;

a plurality of first n-MOSFETs, each of which corresponds to one of the first buffer circuits, each of gate terminals being connected to an output terminal of corresponding first buffer circuit, each of drain terminals being connected to a signal line of the first driver control signal, and each of source terminals being applied with second voltage; and a first p-MOSFET, a source terminal being applied first voltage higher than the second voltage, a drain terminal being connected to the signal line of the first driver control signal, and a gate terminal being applied with the input signal, and the second pre-driver unit includes:

a plurality of cascaded second buffer circuits to sequentially delay the input signal;

a plurality of second p-MOSFETs, each of which corresponds to one of the second buffer circuits, each of gate terminals being connected to an output terminal of corresponding second buffer circuit, each of drain terminals being connected to a signal line of the second driver control signal, each of source terminals being applied with the first voltage; and a second n-MOSFET, a source terminal being applied the second voltage, a drain terminal being connected to the signal line of the second driver control signal, and a gate terminal being applied with the input signal.

* * * * *